US010014300B2

(12) United States Patent
Cantoro et al.

(10) Patent No.: US 10,014,300 B2
(45) Date of Patent: Jul. 3, 2018

(54) INTEGRATED CIRCUIT DEVICES HAVING INTER-DEVICE ISOLATION REGIONS AND METHODS OF MANUFACTURING THE SAME

(71) Applicant: Samsung Electronics Co., Ltd., Suwon-si, Gyeonggi-do (KR)

(72) Inventors: Mirco Cantoro, Suwon-si (KR); Tae-yong Kwon, Suwon-si (KR); Jae-young Park, Yongin-si (KR); Dong-hoon Hwang, Hwaseong-si (KR); Han-ki Lee, Hwaseong-si (KR); So-ra You, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/480,669

(22) Filed: Apr. 6, 2017

(65) Prior Publication Data

US 2017/0317084 A1 Nov. 2, 2017

(30) Foreign Application Priority Data

Apr. 29, 2016 (KR) ........................ 10-2016-0053522

(51) Int. Cl.
*H01L 29/00* (2006.01)
*H01L 27/092* (2006.01)
(Continued)

(52) U.S. Cl.
CPC .. *H01L 27/0924* (2013.01); *H01L 21/823821* (2013.01); *H01L 21/823878* (2013.01);
(Continued)

(58) Field of Classification Search
CPC ......... H01L 27/0924; H01L 21/823821; H01L 21/823878; H01L 29/0649; H01L 29/66795; H01L 29/66545
See application file for complete search history.

(56) References Cited

U.S. PATENT DOCUMENTS 7,994,020 B2  8/2011  Lin et al.
8,445,384 B2  5/2013  Dixit
(Continued)

FOREIGN PATENT DOCUMENTS

JP   06-224187     8/1994
JP   2014-093306   5/2014
KR   10-0291507    7/2001

*Primary Examiner* — Nicholas Tobergte
(74) *Attorney, Agent, or Firm* — Myers Bigel, P.A.

(57) ABSTRACT

An integrated circuit device as provided herein may include a device region and an inter-device isolation region. Within the device region, a fin-type active region may protrude from a substrate, and opposite sidewalls of the fin-type active region may be covered by an inner isolation layer. An outer isolation layer may fill an outer deep trench in the inter-device isolation region. The inner isolation layer may extend away from the device region at an inner sidewall of the outer deep trench and into the inter-device isolation region. There may be multiple fin-type active regions, and trenches therebetween. The outer deep trench and the trenches between the plurality of fin-type active regions may be of different heights. The integrated circuit device and methods of manufacturing described herein may reduce a possibility that various defects or failures may occur due to an unnecessary fin-type active region remaining around the device region.

20 Claims, 36 Drawing Sheets

(51) Int. Cl.
*H01L 29/66* (2006.01)
*H01L 21/8238* (2006.01)
*H01L 29/06* (2006.01)

(52) U.S. Cl.
CPC .... *H01L 29/0649* (2013.01); *H01L 29/66795* (2013.01); *H01L 29/66545* (2013.01)

(56) References Cited

U.S. PATENT DOCUMENTS

| | | |
|---|---|---|
| 8,461,008 B2 | 6/2013 | Cho |
| 8,853,015 B1 | 10/2014 | Kuo et al. |
| 9,117,909 B2 * | 8/2015 | Kuo .................. H01L 21/76224 |
| 9,252,044 B2 | 2/2016 | Basker et al. |
| 2012/0276713 A1 | 11/2012 | Miyahara |
| 2013/0045580 A1 | 2/2013 | Cho |
| 2014/0227857 A1 | 8/2014 | Youn |
| 2014/0264720 A1 | 9/2014 | Lee |
| 2014/0315371 A1 | 10/2014 | Cai et al. |
| 2014/0327088 A1 | 11/2014 | Cai et al. |
| 2015/0243659 A1 | 8/2015 | Huang et al. |
| 2016/0079354 A1 * | 3/2016 | Park .................... H01L 27/0886 257/386 |
| 2016/0293599 A1 * | 10/2016 | You .................... H01L 27/0886 |
| 2016/0293600 A1 * | 10/2016 | You ...................... H01L 23/485 |
| 2016/0379982 A1 * | 12/2016 | You .................... H01L 29/0657 257/369 |
| 2017/0005014 A1 * | 1/2017 | Yamashita .............. H01L 22/12 |

* cited by examiner

INTEGRATED CIRCUIT DEVICES HAVING INTER-DEVICE ISOLATION REGIONS AND METHODS OF MANUFACTURING THE SAME

CROSS-REFERENCE TO RELATED APPLICATION

This application claims priority under 35 U.S.C. § 119 to Korean Patent Application No. 10-2016-0053522 filed on Apr. 29, 2016 in the Korean Intellectual Property Office, the disclosure of which is hereby incorporated by reference in its entirety.

BACKGROUND

1. Field

Aspects of the present disclosure relate to an integrated circuit device, and more specifically, to an integrated circuit device including a field effect transistor.

2. Description of the Related Art

As the electronics industry has been developed, semiconductor devices have been rapidly down-scaled. Demand for a high operating speed of the semiconductor devices has increased, and operation of the semiconductor devices with high accuracy is also desirable.

SUMMARY

According to example embodiments of aspects of the present disclosure, an integrated circuit device may include at least one fin-type active region in a device region between first and second portions of an inter-device isolation region, which may protrude from a substrate in the device region and may extend in a first direction. A plurality of inner isolation layers located in the device region may be provided, which may cover sidewalls of the at least one fin-type active region and may extend in the first direction, and an outer isolation layer may be provided in an outer deep trench in the inter-device isolation region. At least one of the plurality of inner isolation layers may extend away from the device region and toward of the outer deep trench.

According to another example embodiment of aspects of the present disclosure, an integrated circuit device may include: a fin-type active region in a device region of a substrate and extending in a first direction, an inner isolation layer in a trench having a first depth, in the device region, and on a sidewall of the fin-type active region, and an outer isolation layer in an outer deep trench having a second depth deeper than the first depth, around the device region, and contacting the inner isolation layer. The inner isolation layer may extend away from the device region at an inner sidewall of the outer deep trench. The outer isolation layer may have a sloped sidewall contacting the inner isolation layer, and the sloped sidewall may be inclined such that a distance between the fin-type active region and the sloped sidewall of the outer isolation layer is shorter as the sloped sidewall is closer to the substrate.

According to another example embodiment of aspects of the present disclosure, a method of manufacturing an integrated circuit device may include etching a portion of a substrate including a device region and an inter-device isolation region to form a plurality of first fin-type active regions and a plurality of second fin-type active regions extending in a first direction, the plurality of first fin-type active regions in the device region and the plurality of second fin-type active regions in the inter-device isolation region, forming a plurality of inner isolation layers on sidewalls of the plurality of first fin-type active regions and the plurality of second fin-type active regions, etching the plurality of second fin-type active regions and the plurality of inner isolation layers in the inter-device isolation region to form an outer trench in the inter-device isolation region such that at least one fin-type portion of one fin-type active region of the plurality of second fin-type active regions remains in the inter-device isolation region after the etching, converting the at least one fin-type portion that remains in the inter-device isolation region after the etching into at least one fin-type insulating part, forming an outer gap-fill insulating layer in the outer trench, and removing a portion of the plurality of inner isolation layers in the device region to expose upper portions of the first plurality of fin-type active regions in the device region.

According to another example embodiment of aspects of the present disclosure, an integrated circuit device is provided. The integrated circuit device may include a device region on a substrate, wherein the device region is between a first portion and a second portion of an isolation region. The integrated circuit device may include a plurality of fin-type active regions in the device region, and each fin-type active region may include sidewalls, with each sidewall may have thereon a respective inner isolation layer from a plurality of inner isolation layers. The integrated circuit device may include an outer isolation layer in an outer trench in the isolation region. The plurality of fin-type active regions may include an outermost fin-type active region, which may correspond with an outermost one of the inner isolation layers. The outermost one of the inner isolation layers may extend away from the device region and into the isolation region.

DETAILED DESCRIPTION

Figure 1A:
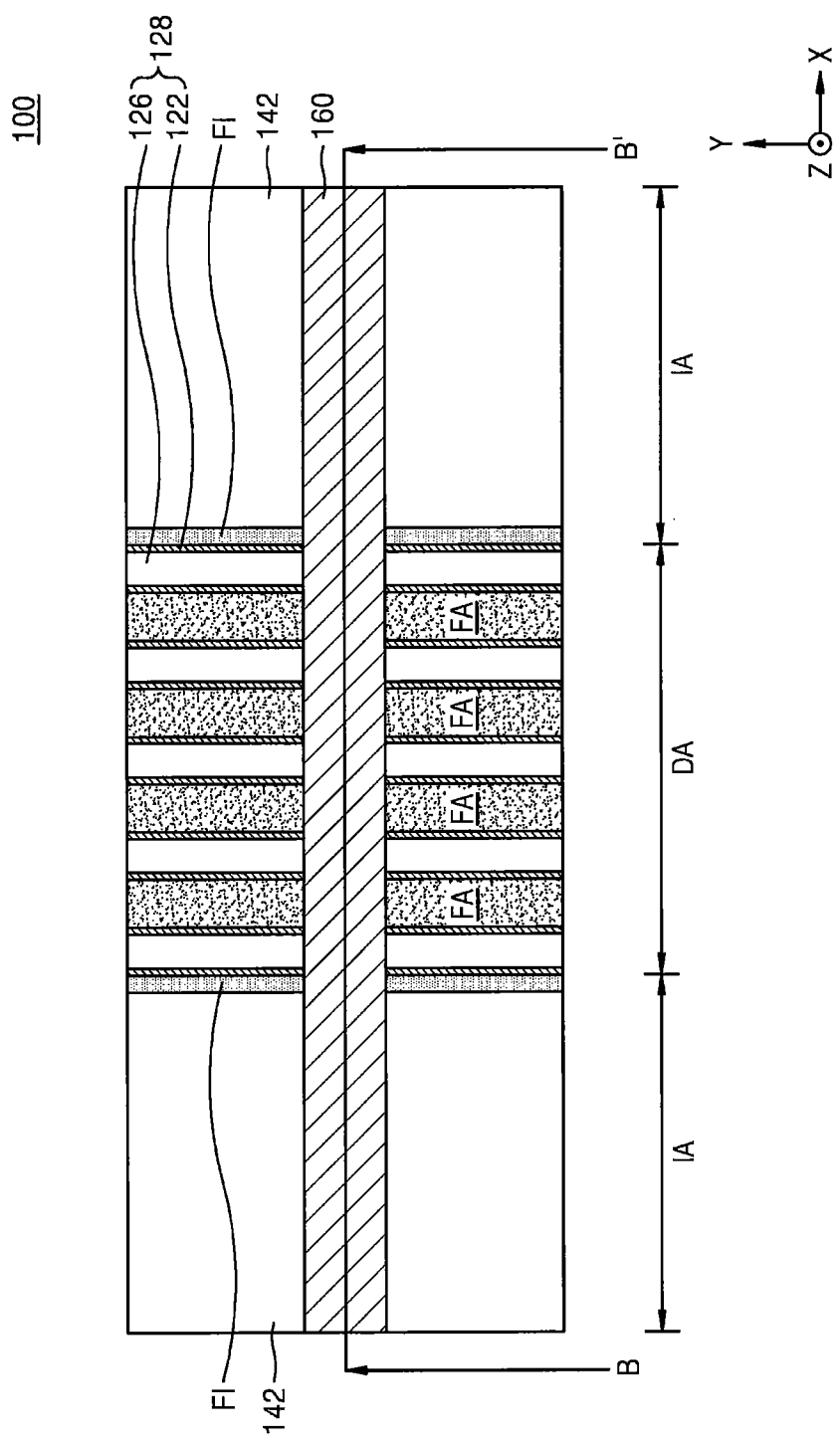
FIG. 1A is a layout diagram illustrating essential configurations of an integrated circuit device according to an example embodiment.

Various example embodiments will now be described more fully with reference to the accompanying drawings in which some example embodiments are shown. However, the aspects of the present disclosure illustrated in the drawings may be embodied in many alternate forms and should not be construed as limited to only the example embodiments set forth therein.

Figure 1B:
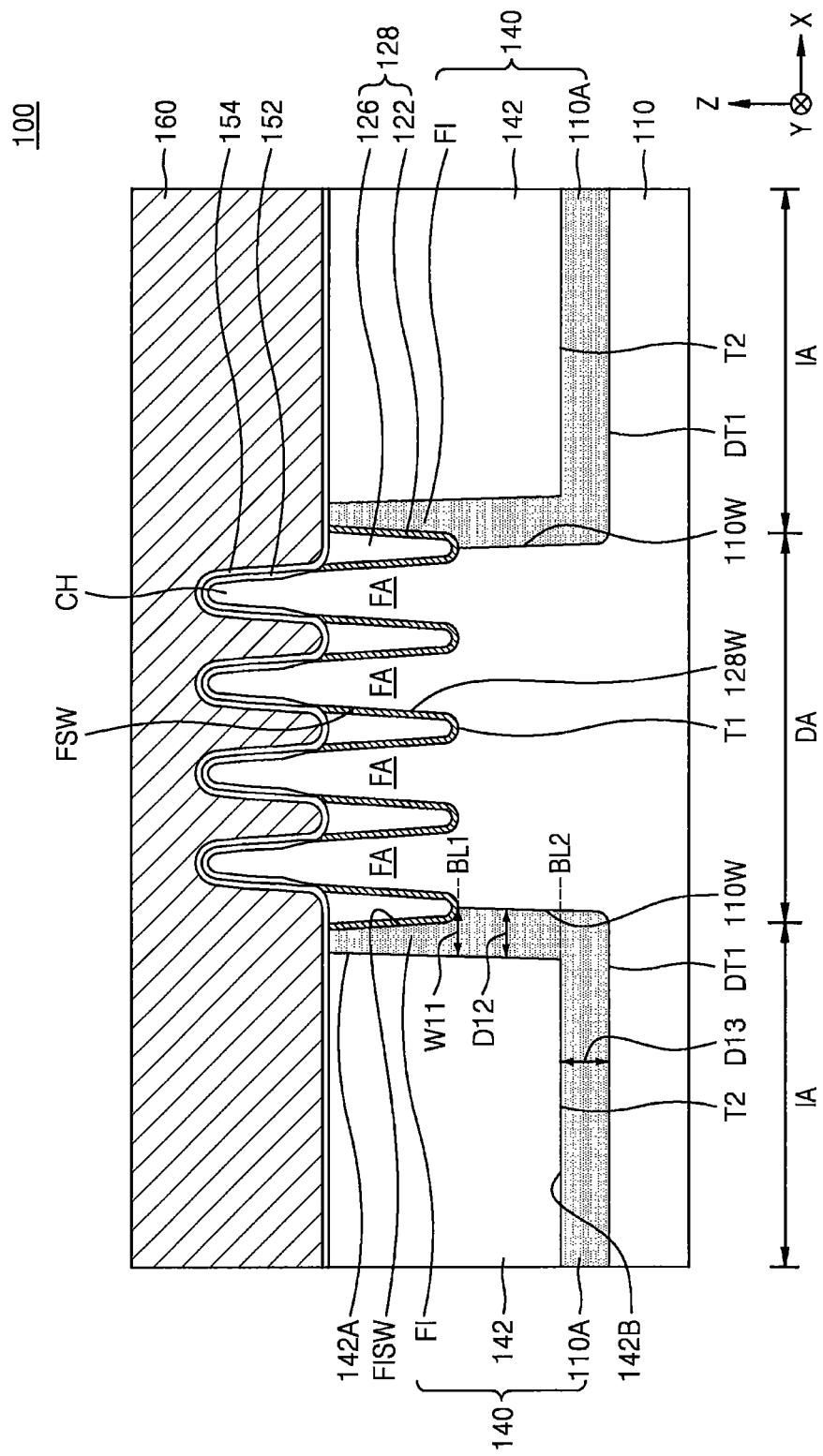
FIG. 1B is a cross-sectional view taken along line B-B' of FIG. 1A.

FIG. 1A is a layout diagram illustrating an integrated circuit device according to aspects of the present disclosure. FIG. 1B is a cross-sectional view taken along line B-B' of FIG. 1A. With reference to FIGS. 1A and 1B, configurations of an integrated circuit device 100 including a fin field effect transistor (FinFET) are described.

Referring to FIGS. 1A and 1B, the integrated circuit device 100 may include a substrate 110 including a device region DA and an inter-device isolation region IA surrounding the device region DA.

Figure 13A:
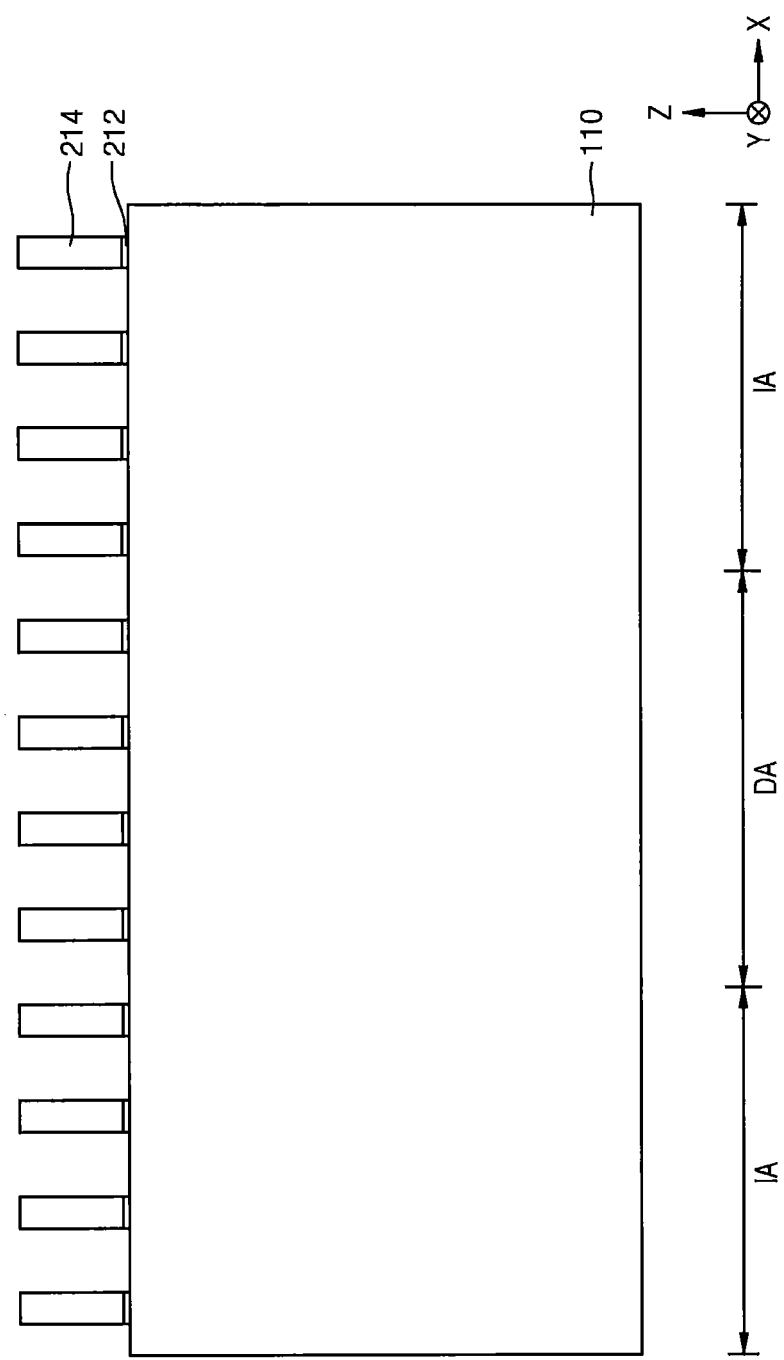
FIGS. 13A to 13J are cross-sectional views illustrating stages of a method of manufacturing an integrated circuit device according to an example embodiment.

The substrate 110 may have a main surface extending in a horizontal plane (having, for example, an X direction and a Y direction). The substrate 110 may include a semiconductor such as silicon (Si) or germanium (Ge), and/or a semiconductor compound such as silicon-germanium (SiGe), silicon carbide (SiC), gallium arsenide (GaAs), indium arsenide (InAs), or indium phosphide (InP). The substrate 110 may include a conductive region, for example, a well doped with impurities or a structure doped with impurities. The substrate 110 is described below in further detail with reference to FIG. 13A.

The device region DA of the substrate 110 may include an NMOS region in which a plurality of NMOS transistors are formed or a PMOS region in which a plurality of PMOS transistors are formed.

In the device region DA, a plurality of fin-type active regions FA may protrude in a vertical direction orthogonal to the horizontal plane (e.g., a Z direction) with respect to the main surface of the substrate 110. The plurality of fin-type active regions FA may extend parallel to each other along the Y direction.

In the device region DA, a plurality of inner isolation layers 128 may extend in the Y direction to cover opposite sidewalls of the plurality of fin-type active regions FA. Low portions of the opposite sidewalls of the plurality of fin-type active regions FA may be covered by the plurality of inner isolation layers 128.

The plurality of inner isolation layers 128 may each include an insulating liner 122 that covers the sidewall of each fin-type active region FA, in an inner trench T1 formed around each fin-type active region FA and an inner gap-fill insulating layer 126 that is formed on the insulating liner 122 to fill the inner trench T1.

The insulating liner 122 may include a material capable of applying a stress to a channel region CH in each of the plurality of fin-type active regions FA. In the case in which the NMOS transistor is formed in the device region DA, the insulating liner 122 may include a material capable of applying a tensile stress to the channel region CH. In the case in which the PMOS transistor is formed in the device region DA, the insulating liner 122 may include a material capable of applying a compressive stress to the channel region CH. In some embodiments, the insulating liner 122 may include a single- or multi-layer formed of at least one of silicon nitride (SiN), silicon oxynitride (SiON), silicon boron nitride (SiBN), silicon carbide (SiC), hydrogenated silicon carbide (SiC:H), silicon carbon nitride (SiCN), hydrogenated silicon carbon nitride (SiCN:H), silicon oxycarbonitride (SiOCN), hydrogenated silicon oxycarbonitride (SiOCN:H), silicon oxycarbide (SiOC) and silicon dioxide ($SiO_2$), but the present disclosure is not limited thereto. In some embodiments, the insulating liner 122 may be omitted.

The inner gap-fill insulating layer 126 may be formed of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), tonen silazene (TOSZ) and/or a combination thereof, but the present disclosure is not limited thereto.

The plurality of fin-type active regions FA may each have sloped sidewalls FSW to have a larger width in the X direction closer to a bottom of each fin-type active region FA. The plurality of inner isolation layers 128 may each have sloped sidewalls 128W facing the sloped sidewalls FSW of the respective fin-type active regions FA.

In FIGS. 1A and 1B, it is illustrated that four fin-type active regions FA are formed in the device region DA, but example embodiments of the present disclosure are not limited thereto. For example, three or less, or five or more fin-type active regions may be formed in the device region DA. As shown in FIG. 1B, the plurality of fin-type active regions FA may each be formed to have the sidewalls having a substantially symmetrical profile relative to a central line extending in the Z direction. However, the example embodiments of the present disclosure are not limited thereto and include the plurality of fin-type active regions FA having various shapes.

An outer deep trench DT1 may be formed in the inter-device isolation region IA to surround the device region DA. The outer deep trench DT1 may be filled with an outer isolation layer 140 surrounding at least a portion of the device region DA.

The outer isolation layer 140 may include a fin-type insulating part FI, a lower insulating part 110A integrally connected to the fin-type insulating part FI, and an outer gap-fill insulating layer 142 formed on the fin-type insulating part FI and on the lower insulating part 110A.

The fin-type insulating part FI may be formed to contact the sidewall of the inner isolation layer 128 located at an outermost side of the device region DA. The fin-type insulating part FI may include a sloped sidewall FISW in contact with the sidewall 128W of an inner isolation layer 128 of the plurality of inner isolation layers 128.

The lower insulating part 110A may extend from the fin-type insulating part FI and along a surface of substrate 110. An outer trench T2 (i.e., a space in which the outer gap-fill insulating layer 142 is formed) may be defined by the fin-type insulating part FI and the lower insulating part 110A. As shown in FIGS. 1A and 1B, a pair of the fin-type insulating part FI having the device region DA therebetween may be formed. For example, the fin-type insulating part FI may be formed at each of opposite sides of the device region DA. The fin-type insulating part FI may have a smaller height than the plurality of fin-type active regions FA.

The fin-type insulating part FI and the lower insulating part 110A may be formed of the same material. The fin-type insulating part FI and the lower insulating part 110A may include the same substance as a substance forming in part the plurality of fin-type active regions FA. For example, in the case in which the plurality of fin-type active regions FA include silicon, the fin-type insulating part FI and the lower insulating part 110A may respectively include silicon oxide or silicon nitride.

A bottom surface level BL2 of the outer trench T2 that is the space in which the outer gap-fill insulating layer 142 is formed may be lower than a bottom surface level BL1 of the inner trench T1 filled with the inner isolation layer 128 (e.g., a depth of the outer trench T2 may be greater than a depth of the inner trench T1). However, in some embodiments, the bottom surface level BL2 might not be lower than the bottom surface level BL1.

In some embodiments, a thickness of the lower insulating part 110A (e.g., a thickness D12 in the X direction and a thickness D13 in the Z direction as shown in FIG. 1B) may respectively be equal to or greater than a maximum width of the fin-type insulating part FI (i.e., a width W11 in the X direction of a bottom portion of the fin-type insulating part FI). In other embodiments, the width W11 of the fin-type insulating part FI may be smaller than a width of the fin-type active region FA in the device region DA.

An outermost one of the plurality of inner isolation layers 128 located at an edge side of the device region DA may have a shape protruding in a direction away from the device region DA at the sidewall 110W of the substrate 110 facing the outer isolation layer 140. The fin-type insulating part FI may contact the sidewall of the outermost inner isolation layer 128 located at the outermost side of the device region DA and may extend parallel to the fin-type active region FA in the device region DA. The sloped sidewall FISW of the fin-type insulating part FI may contact the insulating liner 122 of the outermost inner isolation layer 128. The fin-type insulating part FI may have a width in the X direction gradually increasing closer to the substrate 110. As the sloped sidewall FISW of the fin-type insulating part FI is closer to the substrate 110, the sloped sidewall FISW may be inclined in a positive or negative direction relative to a vertical line on the substrate 110 such that a spaced distance from the fin-type active region FA in the device region DA is shorter.

In some embodiments, the outer gap-fill insulating layer 142 may be formed of a different material from the fin-type insulating part FI and the lower insulating part 110A. In some embodiments, the outer gap-fill insulating layer 142 may be formed of the same material as the fin-type insulating part FI and the lower insulating part 110A. In this case, the outer gap-fill insulating layer 142 and the fin-type insulating part FI may be distinguished by an interface 142A having the same cross-sectional profile as the outer trench T2, and the outer gap-fill insulating layer 142 and the lower insulating part 110A may also be distinguished by the interface 142B.

In some embodiments, the outer gap-fill insulating layer 142 may be formed of FSG, USG, BPSG, PSG, FOX, PE-TEOS, TOSZ or a combination thereof, but the present disclosure is not limited thereto.

A gate insulating layer 154 and a gate line 160 may be formed in the device region DA to cover the opposite sidewalls and a top surface of each of the plurality of fin-type active regions FA. The gate insulating layer 154 and the gate line 160 may extend in the Y direction (i.e., an extension direction of the plurality of fin-type active regions FA) crossing the X direction in the device region DA and the inter-device isolation region IA on the substrate 110. An interface layer 152 may be interposed between the channel region CH of each of the plurality of fin-type active regions FA and the gate insulating layer 154.

The interface layer 152 may be formed of silicon oxide, silicon oxynitride, silicate, a combination of silicate and silicon oxide, or a combination of silicate and silicon oxynitride. The gate insulating layer 154 may be formed of a high-k dielectric layer having a higher dielectric constant than the interface layer 152. The gate line 160 may include a work function adjustment metal-containing layer and a gap-fill metal-containing layer filling a space that is formed on the work function adjustment metal-containing layer. In some embodiments, the gate line 160 may have a structure in which a metal nitride layer, a metal layer, a conductive capping layer and the gap-fill metal layer are sequentially stacked. The interface layer 152, the gate insulating layer 154 and the gate line 160 will be described below in further detail with reference to FIG. 13J In the device region DA, source/drain regions (not shown) may be formed in each of the plurality of fin-type active regions FA at opposite sides of the gate line 160. The source/drain regions may include a semiconductor layer epitaxially grown from each fin-type active region. In some embodiments, the source/drain regions may be formed of a plurality of SiGe epitaxial layers, a Si epitaxial layer, and/or a SiC epitaxial layer.

Even if errors in a variety of process parameters, such as line edge roughness (LER), critical dimension uniformity (CDU), overlay, optical proximity effect, or other like errors occur during the process of manufacturing the integrated circuit device 100 described with reference to FIGS. 1A and 1B, a possibility that various defects or failures may occur due to an unnecessary fin-type active region remaining around the device region may be reduced. Accordingly, in a down-scaled integrated circuit device, even if a pitch of the active regions is small depending on reduction of a size of the transistor, the defects or failures caused by a damaged portion of the active regions remaining around the device region due to lack of a process margin may be reduced or prevented. Therefore, the integrated circuit device with a desired electrical performance can be manufactured.

Figure 2:
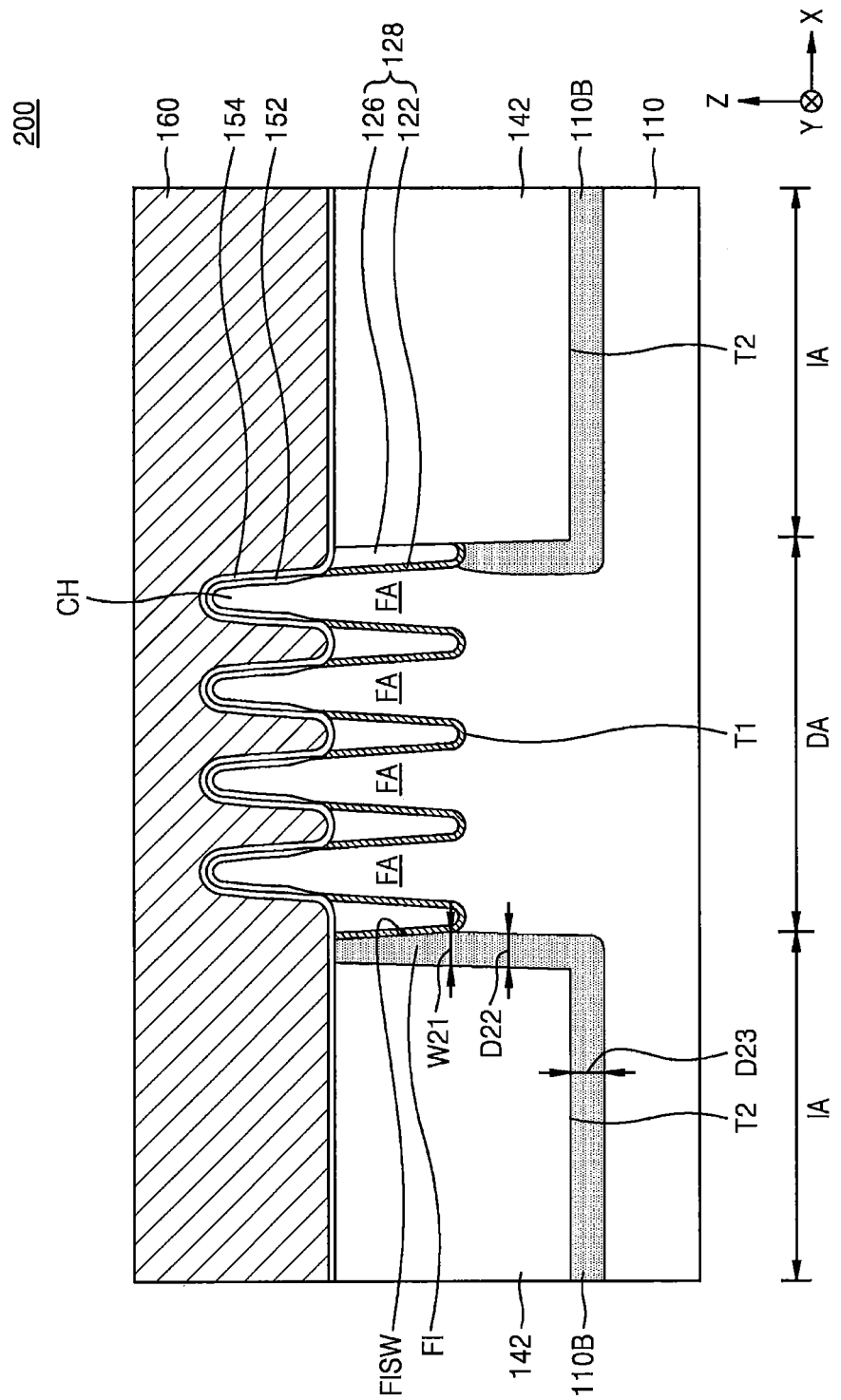
FIG. 2 is a cross-sectional view illustrating an integrated circuit device according to an example embodiment.

FIG. 2 is a cross-sectional view illustrating an integrated circuit device according to an example embodiment. In FIG. 2, the same reference numerals denote the same elements as in FIGS. 1A and 1B, and detailed descriptions thereof are omitted here for brevity.

Referring to FIG. 2, an integrated circuit device 200 may include substantially the same elements or configurations as illustrated in FIGS. 1A and 1B. However, in the integrated circuit device 200, a fin-type insulating part FI may be formed at only a first side of a device region DA. At a second side of the device region DA (illustrated toward the right side of FIG. 2), an inner isolation layer 128 may be exposed at an inner sidewall of an outer trench T2. Accordingly, in a portion of an inter-device isolation region IA closer to the first side of the device region DA, a lower insulating part 110B may be integrally connected to the fin-type insulating part FI and may extend along a surface of a substrate 110. However, in a portion of the inter-device isolation region IA closer to the second side of the device region DA, the lower insulating part 110B may contact a bottom surface of an outermost inner isolation layer 128 and may extend from the bottom surface of the outermost inner isolation layer 128 and along the surface of the substrate 110.

The lower insulating part 110B may be the same as the lower insulating part 110A as described with reference to FIGS. 1A and 1B.

In some embodiments, a thickness (e.g., a thickness D22 in an X direction and a thickness D23 in a Z direction) of the lower insulating part 110B defining an outer trench T2 may be equal to or greater than a maximum width of the fin-type insulating part FI (i.e., a width W21 of a bottom portion of the fin-type insulating part FI in the X direction).

Figure 3:
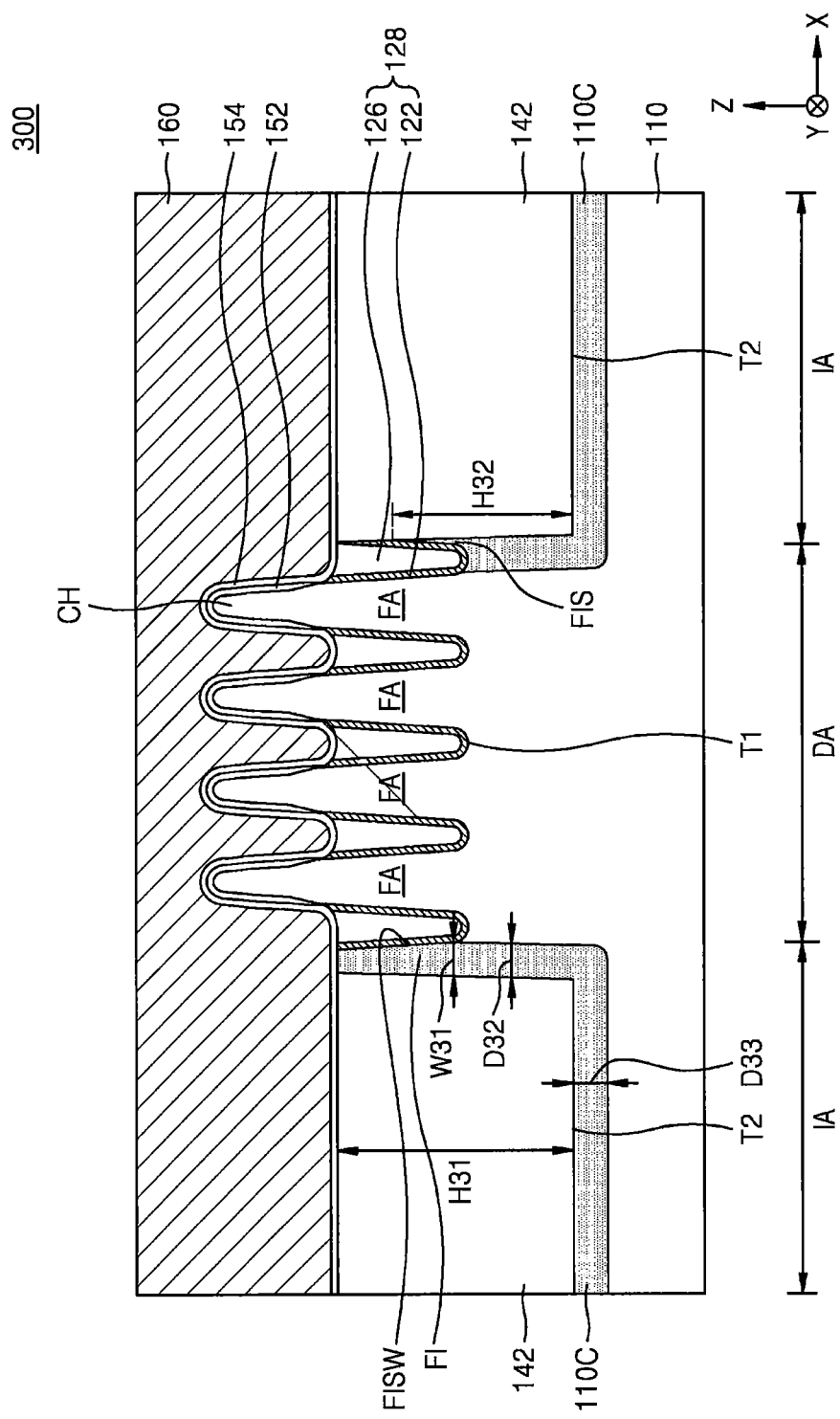
FIG. 3 is a cross-sectional view illustrating an integrated circuit device according to an example embodiment.

FIG. 3 is a cross-sectional view illustrating an integrated circuit device according to an example embodiment. In FIG. 3, the same reference numerals denote the same elements as in FIGS. 1A and 1B, and detailed descriptions thereof are omitted here for brevity.

Referring to FIG. 3, an integrated circuit device 300 may include substantially the same elements or configurations as illustrated in FIGS. 1A and 1B. However, in the integrated circuit device 300, fin-type insulating parts FI and FIS having different configurations or shapes from each other may be formed at opposite sides of a device region DA, respectively. The fin-type insulating parts FI and FIS may have different widths and different heights.

In some embodiments, a height H31 from a bottom surface of an outer trench T2 to a top of the fin-type insulating part FI may be greater than a height H32 from the bottom surface of the outer trench T2 to a top of the fin-type insulating part FIS. In addition, a width of the fin-type insulating part FI in an X direction may be greater than a width of the fin-type insulating part FIS in the X direction.

A lower insulating part 110C integrally connected to the fin-type insulating parts FI and FIS may be formed along a surface of a substrate 110. The lower insulating part 110C may be the same as the lower insulating part 110A as described with reference to FIGS. 1A and 1B.

In some embodiments, a thickness (e.g., a thickness D32 in the X direction and a thickness D33 in a Z direction) of the lower insulating part 110C defining the outer trench T2 may be equal to or greater than a maximum width of each of the fin-type insulating parts FI and FIS (i.e., a width W31 of a bottom portion of the fin-type insulating part FI in the X direction).

Figure 4:
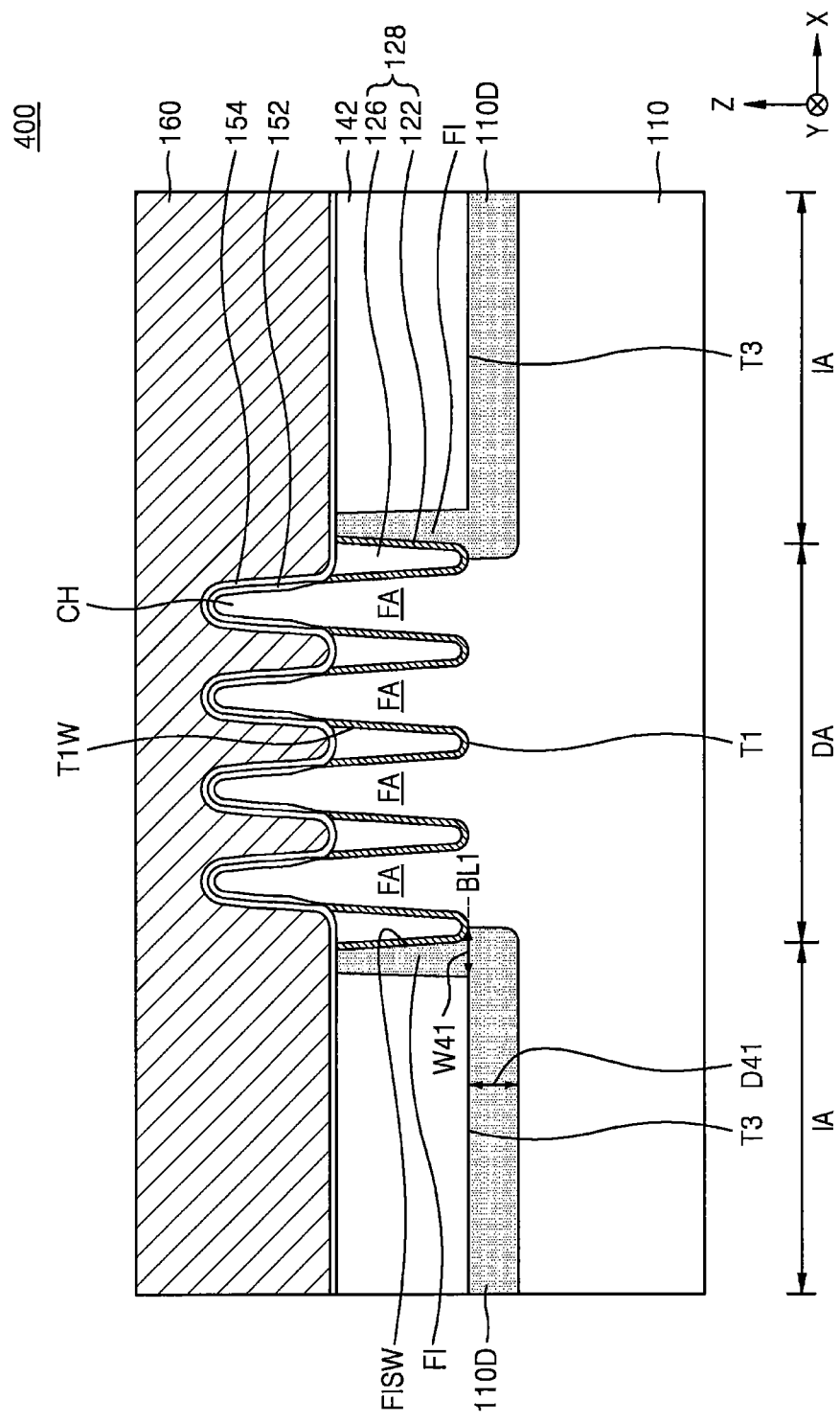
FIG. 4 is a cross-sectional view illustrating an integrated circuit device according to an example embodiment.

FIG. 4 is a cross-sectional view illustrating an integrated circuit device according to an example embodiment and taken along line B-B' of FIG. 1A. In FIG. 4, the same reference numerals denote the same elements as in FIGS. 1A and 1B, and detailed descriptions thereof are omitted here for brevity.

Referring to FIG. 4, an integrated circuit device 400 may include substantially the same elements or configurations as illustrated in FIGS. 1A and 1B. However, in the integrated circuit device 400, an outer trench T3 that is a space in which an outer gap-fill insulating layer 142 is formed may be defined by a fin-type insulating part FI and a lower insulating part 110D. The outer trench T3 may have a bottom surface level that is equal to or similar to a bottom surface level BL1 of a plurality of inner trenches T1 (e.g., a depth of the outer trench T3 may be similar to or the same as a depth of the plurality of inner trenches T1).

At opposite sides of a device region DA, the lower insulating part 110D may be integrally connected to the fin-type insulating part FI and may extend along a surface of a substrate 110. A thickness (e.g., a thickness D41 in a Z direction) of the lower insulating part 110D formed on a bottom surface of the outer trench T3 may be equal to or greater than a maximum width of the fin-type insulating part FI (i.e., a width W41 of a bottom portion of the fin-type insulating part FI in an X direction). The lower insulating part 110D may be the same as the lower insulating part 110A as described with reference to FIGS. 1A and 1B.

Figure 5:
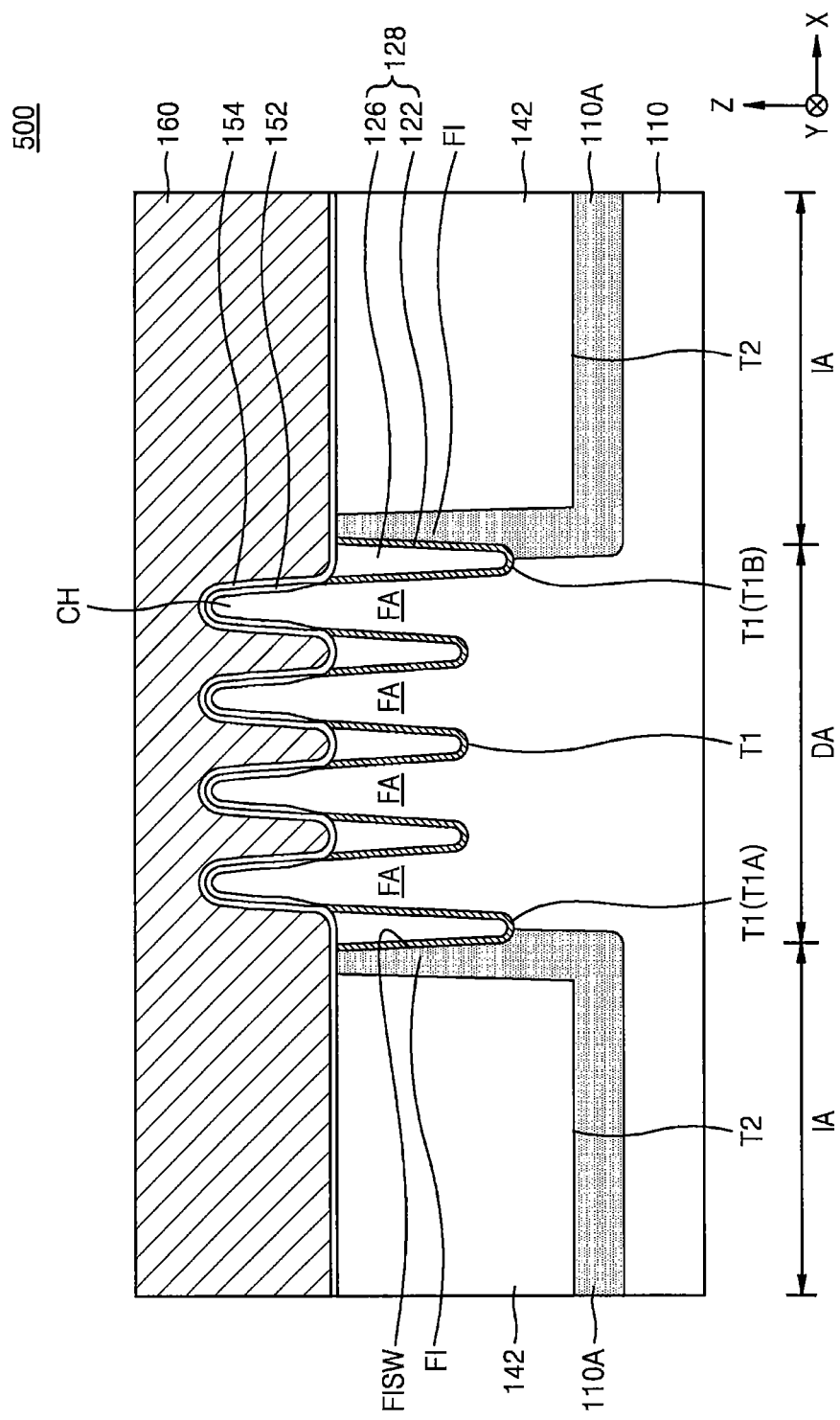
FIG. 5 is a cross-sectional view illustrating an integrated circuit device according to an example embodiment.

FIG. 5 is a cross-sectional view illustrating an integrated circuit device according to an example embodiment and taken along line B-B' of FIG. 1A. In FIG. 5, the same reference numerals denote the same elements as in FIGS. 1A and 1B, and detailed descriptions thereof are omitted here for brevity.

Referring to FIG. 5, an integrated circuit device 500 may include substantially the same elements or configurations as illustrated in FIGS. 1A and 1B. However, in the integrated circuit device 500, outermost inner trenches T1A and T1B among a plurality of inner trenches T1 formed in a device region DA may have a greater depth than other inner trenches T1, and an inner isolation layer 128 formed in the outermost inner trenches T1A and T1B may have a greater height than the inner isolation layer 128 formed in the other inner trenches T1.

Figure 6:
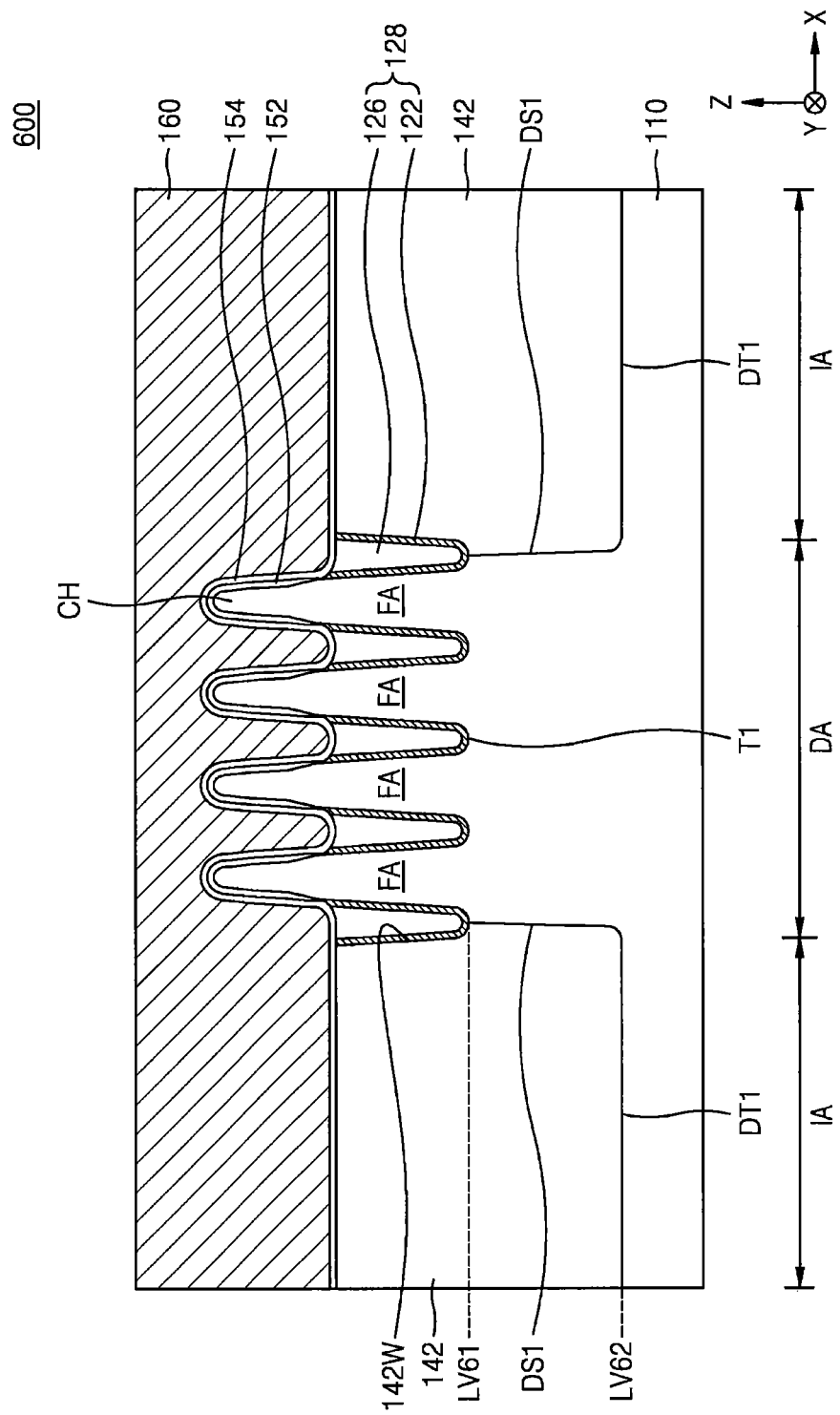
FIG. 6 is a cross-sectional view illustrating an integrated circuit device according to an example embodiment.

FIG. 6 is a cross-sectional view illustrating an integrated circuit device according to an example embodiment. In FIG. 6, the same reference numerals denote the same elements as in FIGS. 1A and 1B, and detailed descriptions thereof are omitted here for brevity.

Referring to FIG. 6, an integrated circuit device 600 may include substantially the same elements or configurations as illustrated in FIGS. 1A and 1B. However, the integrated circuit device 600 may not include the fin-type insulating part FI and the lower insulating part 110A as shown in FIGS. 1A and 1B, in an inter-device isolation region IA.

In addition, an outer deep trench DT1 having a greater depth than the outer trench T2 as shown in FIG. 1B may be formed in the inter-device isolation region IA. The outer deep trench DT1 may be filled with an outer gap-fill insulating layer 142, and the outer gap-fill insulating layer 142 may be in direct contact with a substrate 110. The outer gap-fill insulating layer 142 may be directly disposed on a bottom surface and an inner sidewall DS1 of the outer deep trench DT1. Further, the outer gap-fill insulating layer 142 may be in direct contact with an outermost one of a plurality of inner isolation layers 128. The outermost one of the plurality of inner isolation layers 128 may have a shape protruding in a direction away from a device region DA at the inner sidewall DS1 of the outer deep trench DT1.

The outer gap-fill insulating layer 142 may have a sloped sidewall 142W contacting the outermost inner isolation layer 128. As the sloped sidewall 142W is closer to the substrate 110, the sloped sidewall 142W may be inclined such that a spaced distance from a fin-type active region FA is shorter. The sloped sidewall 142W may be positioned at a higher level than the inner sidewall DS1 of the outer deep trench DT1.

Figure 7:
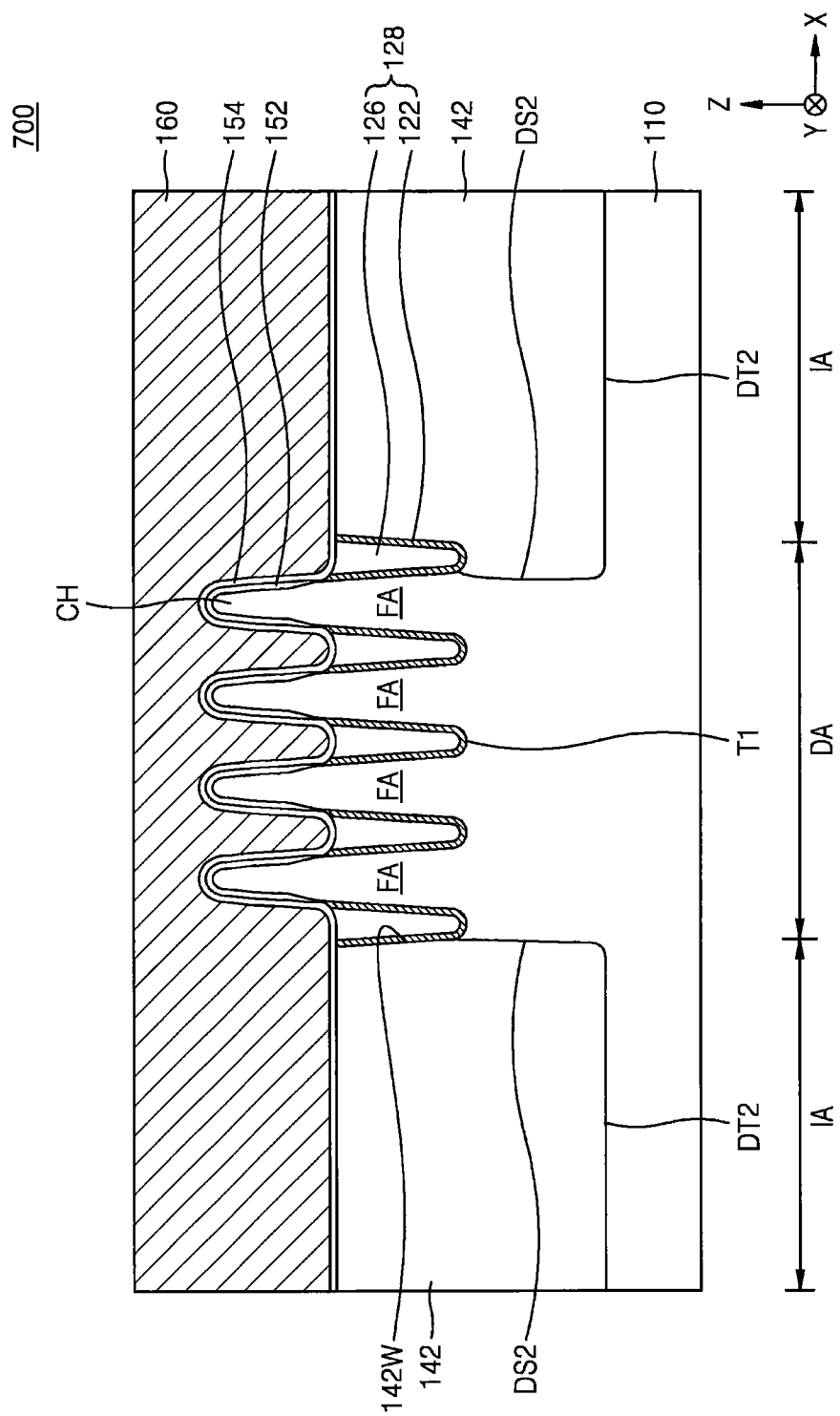
FIG. 7 is a cross-sectional view illustrating an integrated circuit device according to an example embodiment.

FIG. 7 is a cross-sectional view illustrating an integrated circuit device according to an example embodiment. In FIG. 7, the same reference numerals denote the same elements as in FIGS. 1A and 6, and detailed descriptions thereof are omitted here for brevity.

Referring to FIG. 7, an integrated circuit device 700 may include substantially the same elements or configurations as the integrated circuit device 200 illustrated in FIG. 2. However, the integrated circuit device 700 may not include the fin-type insulating part FI and the lower insulating part 110B as shown in FIG. 2, in an inter-device isolation region IA.

In addition, an outer deep trench DT2 having a greater depth than the outer trench T2 shown in FIG. 2 may be formed in the inter-device isolation region IA. The outer deep trench DT2 may be filled with an outer gap-fill insulating layer 142, and the outer gap-fill insulating layer 142 may be in direct contact with a substrate 110 and an inner isolation layer 128. An outermost inner isolation layer 128 located at an edge side of a device region DA among the inner isolation layers 128 formed in the device region DA may have a shape protruding in a direction away from the device region DA at an inner sidewall DS2 of the outer deep trench DT2.

Figure 8:
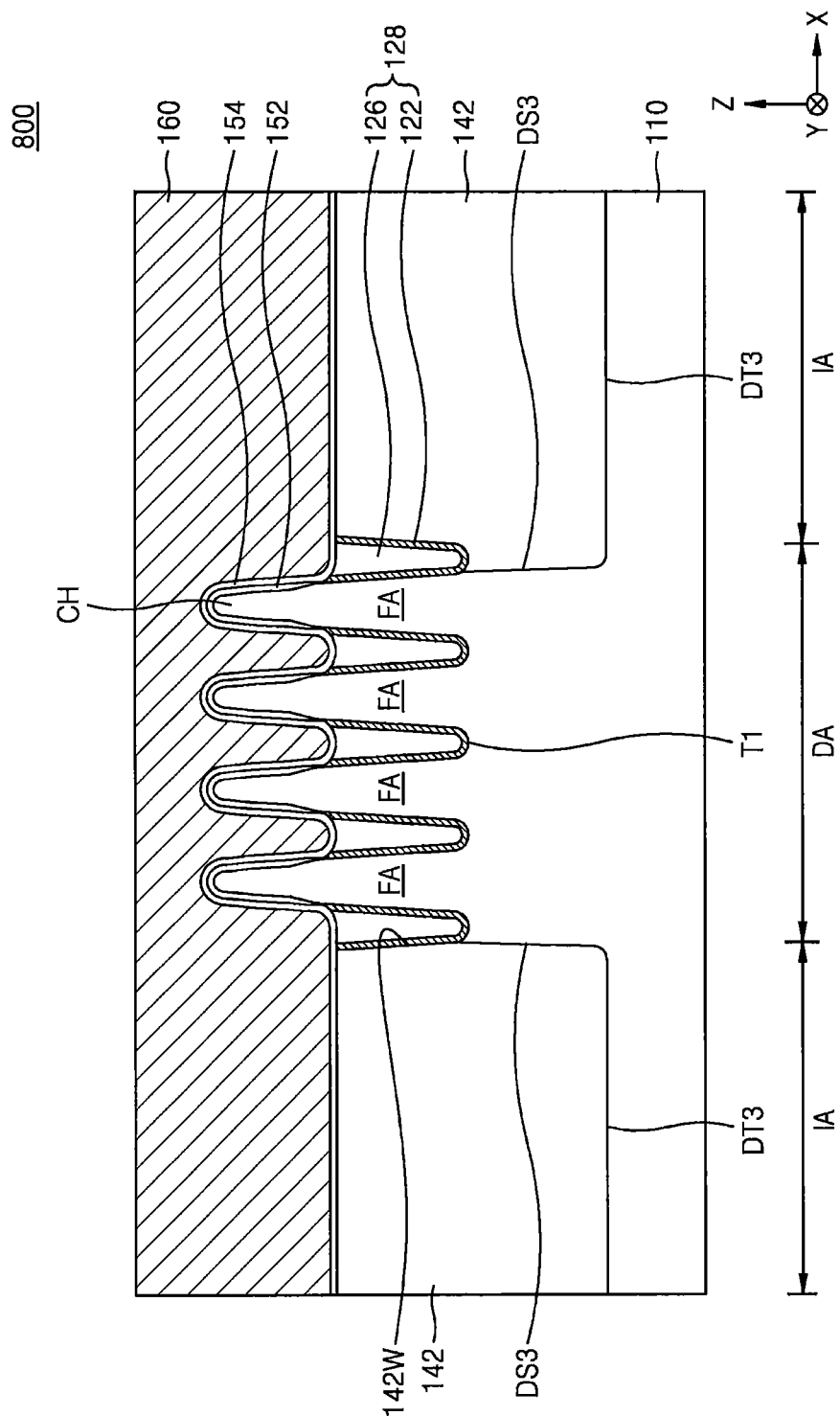
FIG. 8 is a cross-sectional view illustrating an integrated circuit device according to an example embodiment.

FIG. 8 is a cross-sectional view illustrating an integrated circuit device according to an example embodiment. In FIG. 8, the same reference numerals denote the same elements as in FIGS. 1A and 6, and detailed descriptions thereof are omitted here for brevity.

Referring to FIG. 8, an integrated circuit device 800 may include substantially the same elements or configurations as the integrated circuit device 300 illustrated in FIG. 3. However, the integrated circuit device 800 may not include the fin-type insulating part FI and the lower insulating part 110C as shown in FIG. 3, in an inter-device isolation region IA.

In addition, an outer deep trench DT3 having a greater depth than the outer trench T2 shown in FIG. 3 may be formed in the inter-device isolation region IA. The outer deep trench DT3 may be filled with an outer gap-fill insulating layer 142, and the outer gap-fill insulating layer 142 may be in direct contact with a substrate 110 and an inner isolation layer 128. An outermost inner isolation layer 128 located at an edge side of a device region DA among the inner isolation layers 128 formed in the device region DA may have a shape protruding in a direction away from the device region DA at an inner sidewall DS3 of the outer deep trench DT3.

Figure 9:
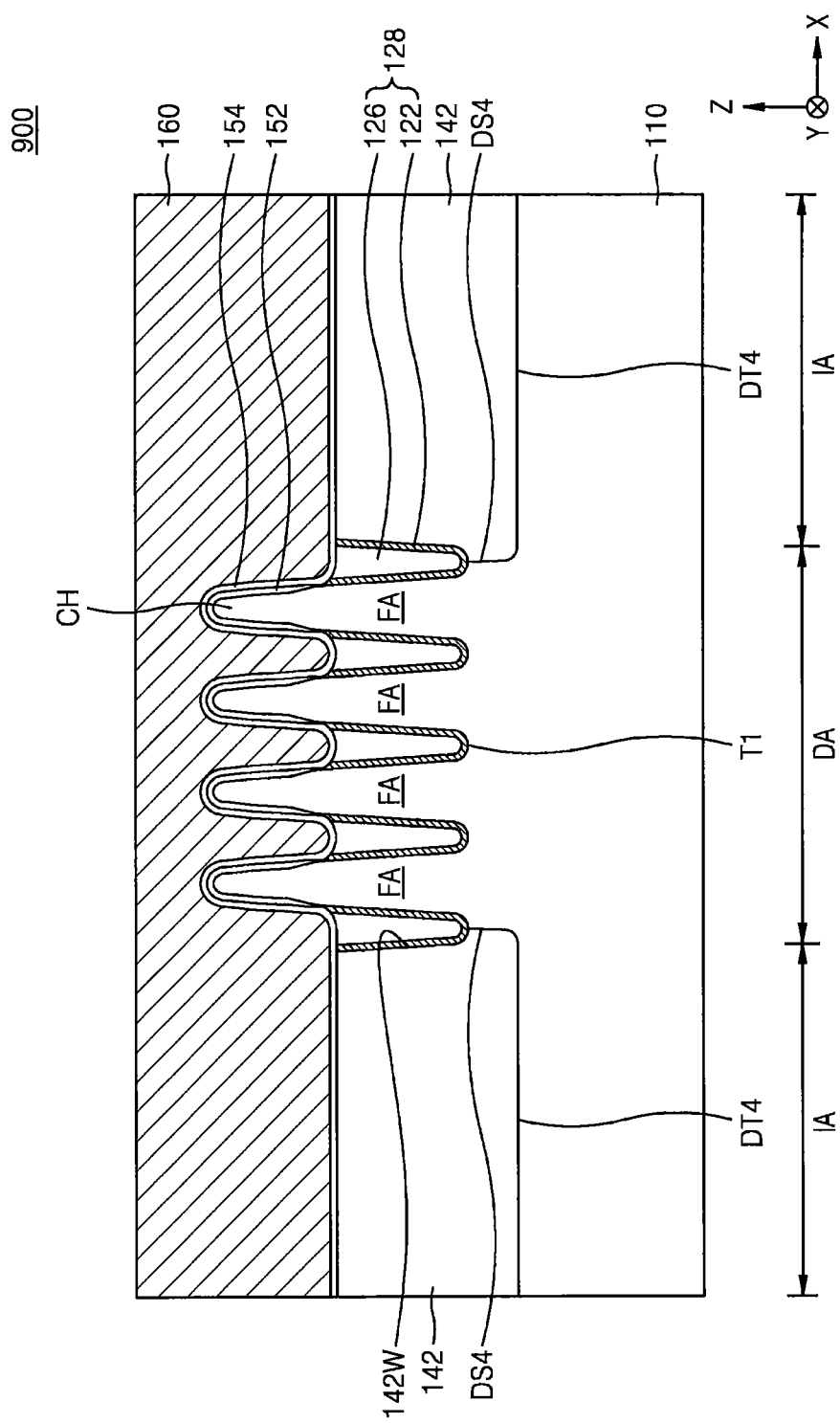
FIG. 9 is a cross-sectional view illustrating an integrated circuit device according to an example embodiment.

FIG. 9 is a cross-sectional view illustrating an integrated circuit device according to an example embodiment. In FIG. 9, the same reference numerals denote the same elements as in FIGS. 1A and 6, and detailed descriptions thereof are omitted here for brevity.

Referring to FIG. 9, an integrated circuit device 900 may include substantially the same elements or configurations as the integrated circuit device 400 illustrated in FIG. 4. However, the integrated circuit device 900 may not include the fin-type insulating part FI and the lower insulating part 110D as shown in FIG. 4, in an inter-device isolation region IA.

In addition, an outer deep trench DT4 having a greater depth than the outer trench T3 shown in FIG. 4 may be formed in the inter-device isolation region IA. The outer deep trench DT4 may be filled with an outer gap-fill insulating layer 142, and the outer gap-fill insulating layer 142 may be in direct contact with a substrate 110 and an inner isolation layer 128. An outermost inner isolation layer 128 located at an edge side of a device region DA among the inner isolation layers 128 formed in the device region DA may have a shape protruding in a direction away from the device region DA at an inner sidewall DS4 of the outer deep trench DT4.

Figure 10:
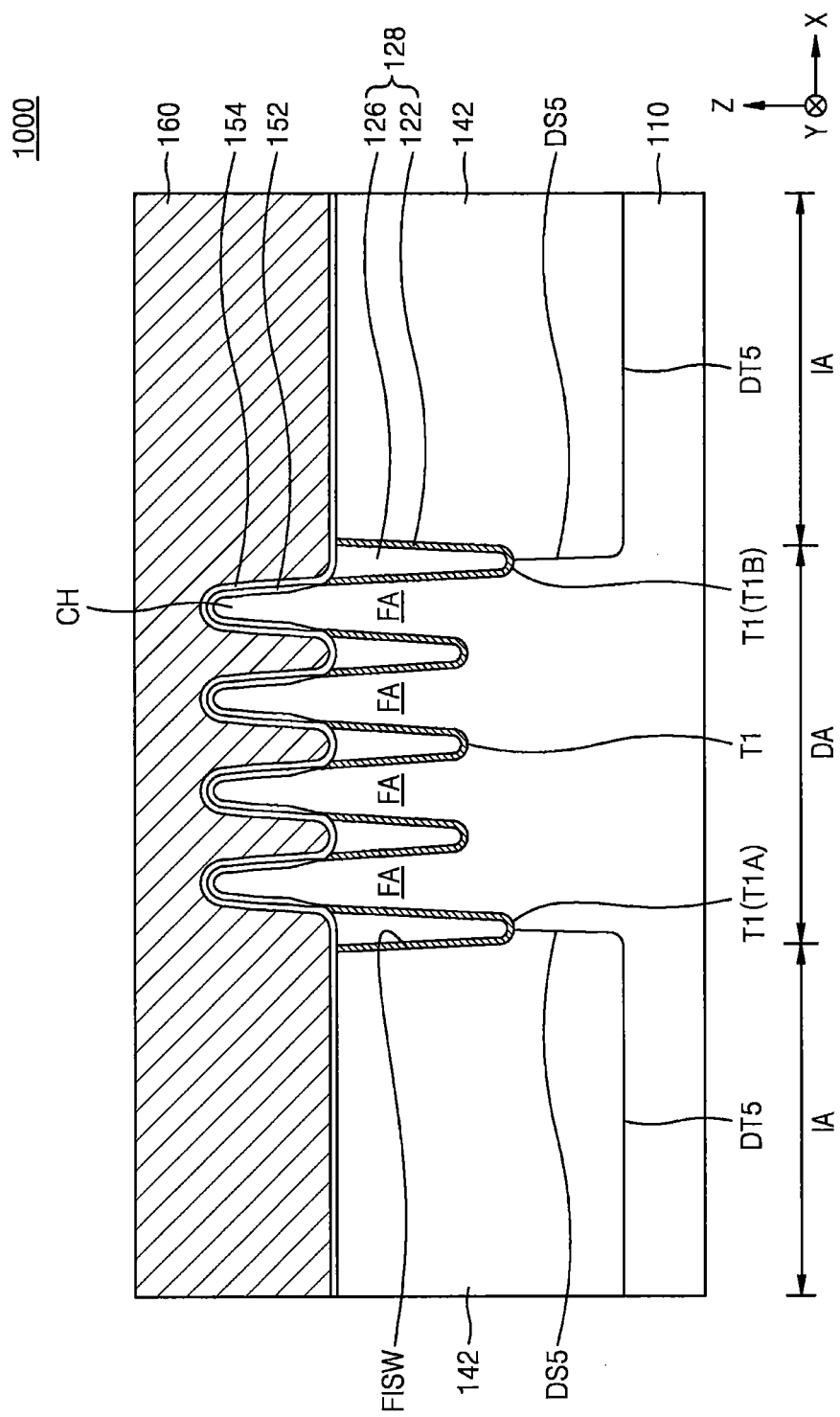
FIG. 10 is a cross-sectional view illustrating an integrated circuit device according to an example embodiment.

FIG. 10 is a cross-sectional view illustrating an integrated circuit device according to an example embodiment. In FIG. 10, the same reference numerals denote the same elements as in FIGS. 1A and 6, and detailed descriptions thereof are omitted here for brevity.

Referring to FIG. 10, an integrated circuit device 1000 may include substantially the same elements or configurations as the integrated circuit device 500 illustrated in FIG. 5. However, the integrated circuit device 1000 may not include the fin-type insulating part FI and the lower insulating part 110A as shown in FIG. 5, in an inter-device isolation region IA.

In addition, an outer deep trench DT5 having a greater depth than the outer trench T2 shown in FIG. 5 may be formed in the inter-device isolation region IA. The outer deep trench DT5 may be filled with an outer gap-fill insulating layer 142, and the outer gap-fill insulating layer 142 may be in direct contact with a substrate 110 and an inner isolation layer 128. An outermost inner isolation layer 128 located at an edge side of a device region DA among the inner isolation layers 128 formed in the device region DA may have a shape protruding in a direction away from the device region DA at an inner sidewall DS5 of the outer deep trench DT5.

As discussed above, even if errors in a variety of process parameters, such as line edge roughness (LER), critical dimension uniformity (CDU), overlay, optical proximity effect, etc. occur during the process of manufacturing the integrated circuit devices 200, 300, 400, 500, 600, 700, 800, 900 and 1000 described with reference to FIGS. 2 to 10, a possibility that various defects or failures may occur due to an unnecessary fin-type active region remaining around the device region may be reduced. Accordingly, in down-scaled integrated circuit devices, even if a pitch of the active regions is small depending on reduction of a size of the transistor, the defects or failures caused by a damaged portion of the active regions remaining around the device region due to lack of a process margin may be reduced or prevented. Therefore, the integrated circuit devices with a desired electrical performance can be manufactured.

Figure 11:
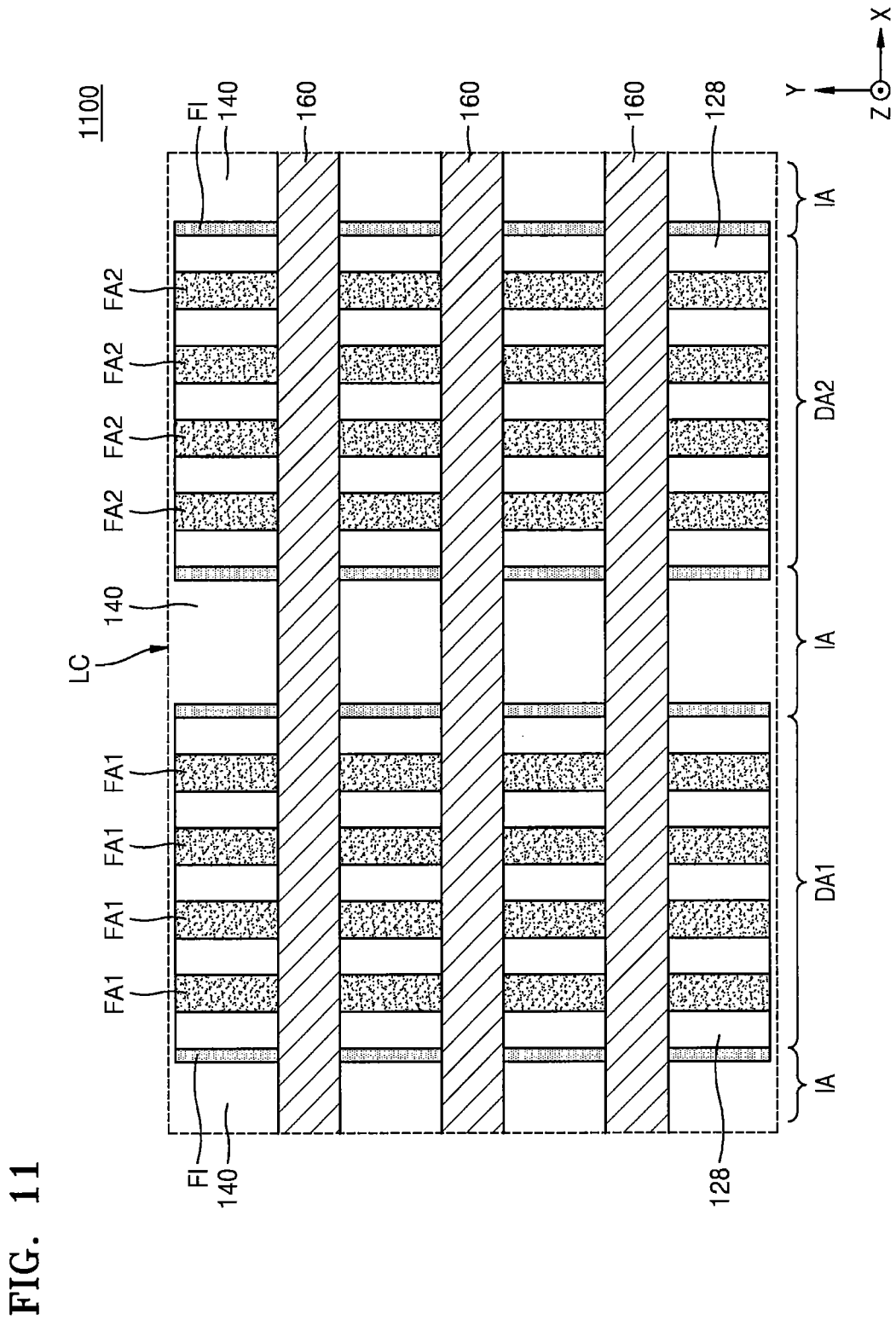
FIG. 11 is a layout diagram illustrating an integrated circuit device according to an example embodiment.

FIG. 11 is a layout diagram illustrating an integrated circuit device according to an example embodiment. An integrated circuit device 1100 including a logical cell region LC including a FinFET device is described with reference to FIG. 11. In FIG. 11, the same reference numerals denote the same elements as in FIGS. 1A to 10, and detailed descriptions thereof are omitted here for brevity.

Referring to FIG. 11, the integrated circuit device 1100 may include the logical cell region LC.

The logical cell region LC may include a first device region DA1 and a second device region DA2 in which a plurality of fin-type regions FA1 and FA2 protruding in a vertical direction (Z direction) from a substrate 110 are formed. The first and second device regions DA1 and DA2 may each be surrounded by an inter-device isolation region IA.

The inter-device isolation region IA may include a fin-type insulating part FI extending parallel to the plurality of fin-type active regions FA1 and FA2 and an outer isolation layer 140 covering a sidewall of the fin-type insulating part FI. The fin-type insulating part FI may include any one of various structures as described with reference to FIGS. 1A to 5.

The plurality of fin-type active regions FA1 and FA2 may extend parallel to each other along a direction (Y direction). An inner isolation layer 128 having the same configuration or structure as described with reference to FIGS. 1A and 1B may be formed between the plurality of fin-type active regions FA1 and FA2 in the first and second device region DA1 and DA2. The plurality of fin-type active regions FA1 and FA2 may protrude above the inner isolation layer 128.

A plurality of gate lines 160 may be formed on the substrate 110 having the plurality of fin-type active regions FA1 and FA2 to extend in a direction (X direction) crossing the plurality of fin-type active regions FA1 and FA2.

An interface layer 152 and a gate insulating layer 154 as described with reference to FIGS. 1A and 1B may be interposed between each of the plurality of fin-type active regions FA1 and FA2 and each of the plurality of gate lines 160.

The plurality of gate insulating layers 154 and the plurality of gate lines 160 may cover sidewalls and a top surface of each of the plurality of fin-type active regions FA1 and FA2, the fin-type insulating part FI and an outer isolation layer 140 and may extend in the X direction. A plurality of MOS transistors may be formed along the plurality of gate lines 160. The plurality of MOS transistors may each be a MOS transistor of a three-dimensional structure, of which a channel is formed at sidewalls and a top surface of each of the plurality of fin-type active regions FA1 and FA2.

In some embodiments, MOS transistors having channels of different conductivity types may be formed in the first device region DA1 and the second device region DA2, respectively. For example, NMOS transistors may be formed in the first device region DA1 and PMOS transistors may be formed in the second device region DA2. In other embodiments, MOS transistors having channels of the same conductivity type may be formed in the first and second device regions DA1 and DA2. For example, either NMOS transistors or PMOS transistors may be formed in the first and second device regions DA1 and DA2.

In some embodiments, any one of the integrated circuit devices 100, 200, 300, 400, 500, 600, 700, 800, 900 and 1000 as illustrated in FIGS. 1A to 10 may form a portion of the integrated circuit device 1100 as illustrated in FIG. 11.

Figure 12:
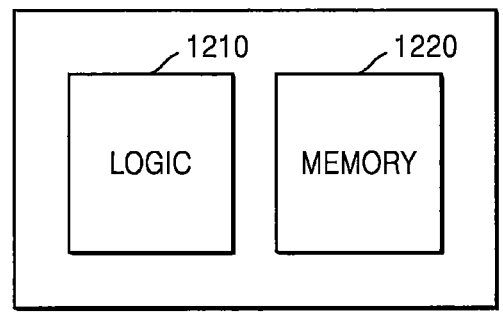
FIG. 12 is a block diagram illustrating an electronic device including an integrated circuit device according to an example embodiment.

FIG. 12 is a block diagram of an electronic device 1200 including at least one of the integrated circuit devices according to the example embodiments described herein.

Referring to FIG. 12, the electronic device 1200 may include a logic area 1210 and a memory area 1220.

The logic area 1210 may include various kinds of logic cells that include a plurality of circuit elements such as transistor, resistor, etc. as a standard cell performing desired logical functions such as counter, buffer, etc. The logical cells may constitute, for example, AND, NAND, OR, NOR, exclusive OR (XOR), exclusive NOR (XNOR), inverter (INV), adder (ADD), buffer (BUF), delay (DLY), filter (FIL), multiplexer (MXT/MXIT). OR/AND/INVERTER (OAI), AND/OR (AO), AND/OR/INVERTER (AOI), D flip-flop, reset flip-flop, master-slaver flip-flop, or latch. However, the logical cells described above are not limited thereto.

The memory area 1220 may include at least one of SRAM, DRAM, MRAM, RRAM and PRAM.

At least one of the logic area 1210 and the memory area 1220 may include at least one of the integrated circuit devices 100, 200, 300, 400, 500, 600, 700, 800, 900, 1000 and 1100 and various modifications thereof in a scope of the present disclosure.

Next, methods of manufacturing integrated circuit devices according to example embodiments of the present disclosure are described in detail.

FIGS. 13A to 13J are cross-sectional views illustrating stages of a method of manufacturing an integrated circuit device according to an example embodiment. With reference to FIGS. 13A to 13J, an example method of manufacturing the integrated circuit device as illustrated in FIGS. 1A and 1B is described. In FIGS. 13A to 13J, the same reference numerals denote the same elements as in FIGS. 1A and 1B, and detailed descriptions thereof are omitted here for brevity.

Referring to 13A, a substrate 110 including a device region DA and an inter-device isolation region IA surrounding at least a portion of the device region DA may be provided. A plurality of pad oxide patterns 212 and a plurality of first mask patterns 214 may be formed in the device region DA and the inter-device isolation region IA.

The plurality of pad oxide patterns 212 and the plurality of first mask patterns 214 may extend along a direction (Y direction) and may respectively be parallel to each other.

The substrate 110 may include a semiconductor such as Si, or Ge and/or a semiconductor compound such as SiGe, SiC, GaAs, InAs, or InP. In some embodiments, the substrate 110 may include at least one of a III-V group semiconductor compound and a IV group semiconductor. The III-V group semiconductor compound may include a binary compound, a ternary compound, or a quaternary compound, each of which is formed by combination of a group III element, for example, at least one of aluminum (Al), gallium (Ga), and indium (In) and a group V element, for example, at least one of phosphorus (P), arsenic (As), and antimony (Sb). For example, the III-V group semiconductor compound may include at least one of InP, $In_zGa_{1-z}As$ ($0 \le z \le 1$) and $Al_zGa_{1-z}As$ ($0 \le z \le 1$). The binary compound may be any one of InP, GaAs, InAs, InSb and GaSb. The ternary compound may be any one of InGaP, InGaAs, AlInAs, InGaSb, GaAsSb and GaAsP. The IV group semiconductor may include Si or Ge. However, the embodiments of the present disclosure are not limited thereto. The III-V group semiconductor compound and the IV group semiconductor such as Ge may be used as a channel material for forming a lower power high speed transistor. A high performance CMOS transistor may be formed using a semiconductor substrate formed of the III-V group semiconductor compound (e.g., GaAs), of which electron mobility is higher than a silicon substrate and a semiconductor substrate formed of the IV group semiconductor (e.g., Ge), of which hole mobility is higher than the silicon substrate. In some embodiments, in the case in which an NMOS transistor is formed on the substrate 110, the substrate 110 may be formed of one of the III-V group semiconductor compounds as mentioned above. In other embodiments, in the case in which a PMOS transistor is formed on the substrate 110, at least a portion of the substrate 110 may be formed of Ge. As an example, the substrate 110 may be a silicon-on-insulator (SOI) substrate. The substrate 110 may include a conductive region, for example, a well region doped with impurities or a structure doped with impurities.

In some embodiments, the plurality of pad oxide patterns 212 may be formed of an oxide layer formed by thermally oxidizing a surface of the substrate 110. The plurality of first mask patterns 214 may be formed of a silicon nitride layer, a silicon oxynitride layer, a spin on glass (SOG) layer, a spin on hardmask (SOH) layer, a photoresist layer or a combination thereof, but the present disclosure is not limited thereto.

Figure 13B:
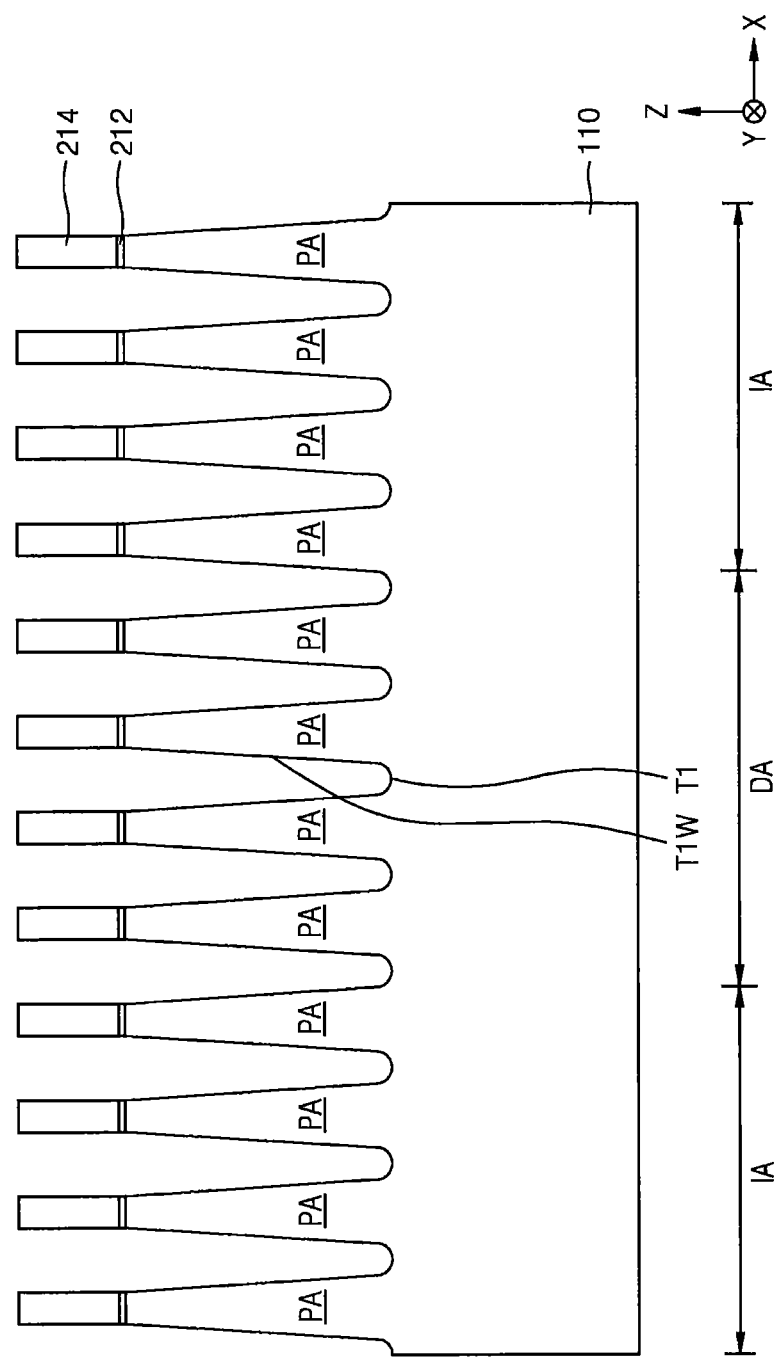

Referring to FIG. 13B, a portion of the substrate 110 may be etched using the plurality of first mask patterns 214 as an etch mask to form a plurality of inner trenches T1 in the substrate 110. As the plurality of inner trenches T1 are formed, a plurality of preliminary fin-type active regions PA may be formed to upwardly protrude from the substrate 110 in a vertical direction (Z direction) to a main surface of the substrate 110 and may extend along a direction (Y direction).

The plurality of preliminary fin-type active regions PA may each be formed to have a high aspect ratio, and thus the plurality of preliminary fin-type active regions PA may each have sloped sidewalls T1W to have a larger width in the X direction closer to a bottom thereof. The plurality of inner trenches T1 may each have a smaller inner width in the X direction closer to a bottom surface thereof due to the sloped sidewalls T1W of each of the plurality of preliminary fin-type active regions PA.

Figure 13C:
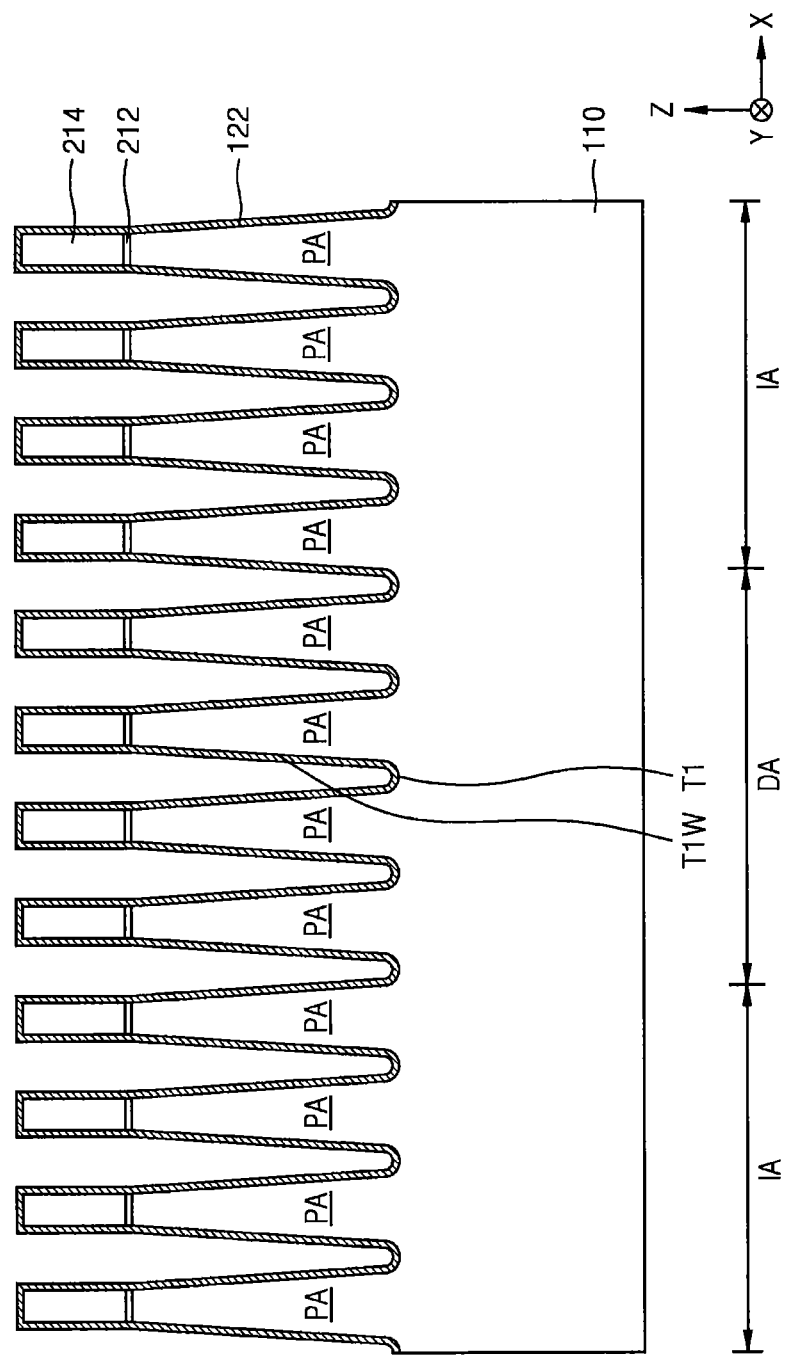

Referring to FIG. 13C, an insulating liner 122 may be formed to cover exposed surfaces of the plurality of preliminary fin-type active regions PA.

The insulating liner 122 may be formed to cover the sloped sidewalls T1W of each of the plurality of preliminary fin-type active regions PA. The insulating liner 122 may conform to a shape of the sloped sidewalls T1W.

In some embodiments, the insulating liner 122 may be formed of a single silicon nitride layer. In other embodiments, the insulating liner 122 may be formed of a multilayer including silicon nitride. The insulating liner 122 may be formed of, for example, a single- or multi-layer that is formed of at least one of silicon nitride (SiN), silicon oxynitride (SiON), silicon boron nitride (SiBN), silicon carbide (SiC), hydrogenated silicon carbide (SiC:H), silicon carbon nitride (SiCN), hydrogenated silicon carbon nitride (SiCN:H), silicon oxycarbonitride (SiOCN), hydrogenated silicon oxycarbonitride (SiOCN:H), silicon oxycarbide (SiOC) and silicon dioxide ($SiO_2$), but the present disclosure is not limited thereto. As an example, the insulating liner 122 may include an oxide liner in direct contact with the sloped sidewalls T1W of each of the plurality of preliminary fin-type active regions PA and a nitride liner covering the oxide liner. The oxide liner may be formed by oxidizing surfaces of the plurality of preliminary fin-type active regions PA. For example, the oxide liner may be formed of an oxide layer that is formed using a thermal oxidation process and the nitride layer may be formed of a silicon nitride layer.

In some embodiments, the insulating liner 122 may have a thickness of about 10 to 100 Å.

In some embodiments, the insulating liner 122 may include a material for applying a tensile stress to a channel region to be obtained from each of plurality of preliminary fin-type active regions PA. In this case, NMOS transistors may be formed using the plurality of preliminary fin-type active regions PA. In other embodiments, the insulating liner 122 may include a material for applying a compressive stress to a channel region to be obtained from each of plurality of preliminary fin-type active regions PA. In this case, PMOS transistors may be formed using the plurality of preliminary fin-type active regions PA.

In some embodiments, the insulating liner 122 may be formed by a plasma enhanced chemical vapor deposition (PECVD) process, a high density plasma (HDP) CVD process, an inductively coupled plasma (ICP) CVD process, or a capacitor coupled (CCP) CVD process, but the present disclosure is not limited thereto.

Figure 13D:
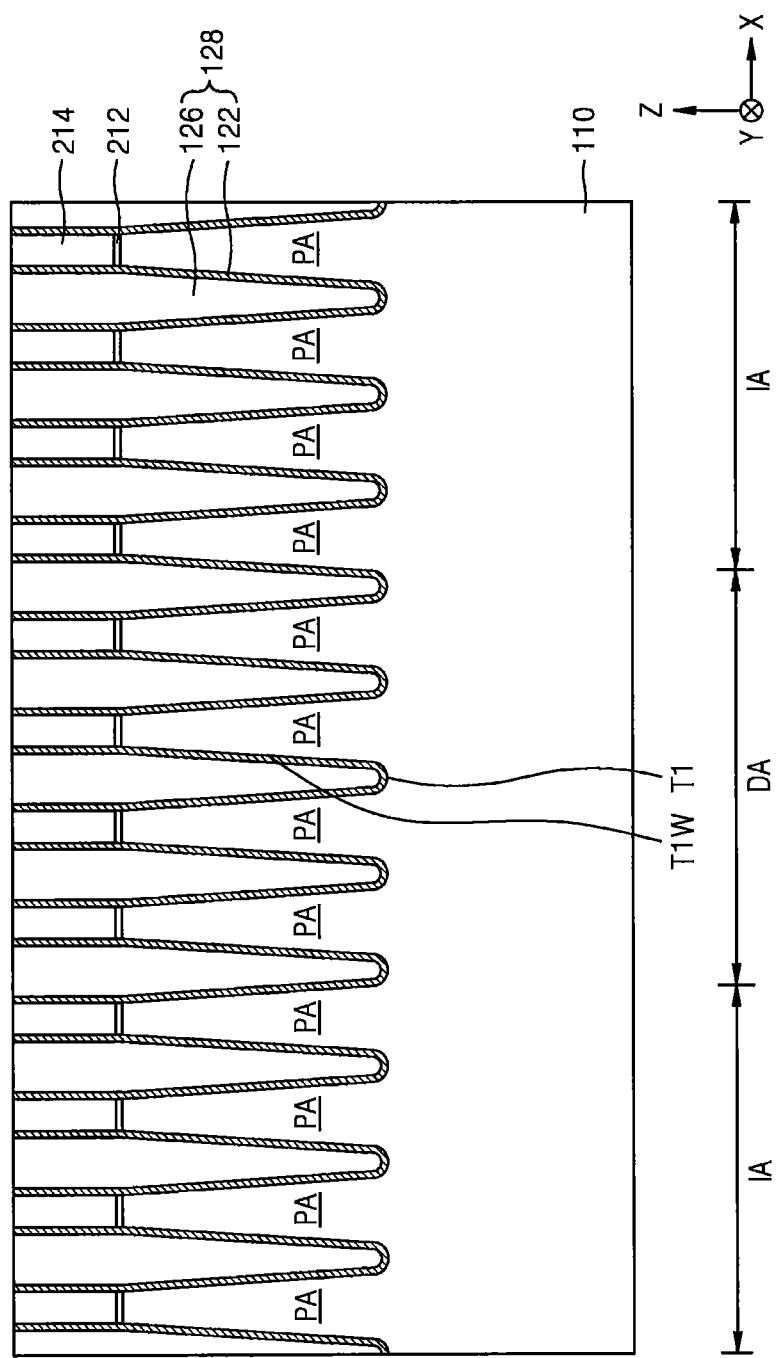

Referring to FIG. 13D, an inner gap-fill insulating layer 126 may be formed on the insulating liner 122 to fill the plurality of inner trenches T1.

To form the inner gap-fill insulating layer 126, an oxide material may be deposited to fill each of the plurality of inner trenches T1, and then the deposited oxide material may be annealed. Next, a portion of the inner gap-fill insulating layer 126 and a portion of the insulating liner 122 may be removed to expose top surfaces of the plurality of first mask patterns 214.

The inner gap-fill insulating layer 126 may be formed by a flowable chemical vapor deposition (FCVD) process or a spin coating process. The inner gap-fill insulating layer 126 may be formed of, for example, fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), tonen silazene (TOSZ) or a combination thereof, but the present disclosure is not limited thereto.

The inner gap-fill insulating layer 126 may have a sloped sidewall facing the sloped sidewall T1W of each of the plurality of preliminary fin-type active regions PA. The sloped sidewall of the inner gap-fill insulating layer 126 may have a gradient corresponding to a gradient of the sloped sidewall T1W of each of the plurality of preliminary fin-type active regions PA.

The insulating liner 122 and the inner gap-fill insulating layer 126 that fill the plurality of inner trenches T1 may constitute a plurality of inner isolation layers 128.

Figure 13E:
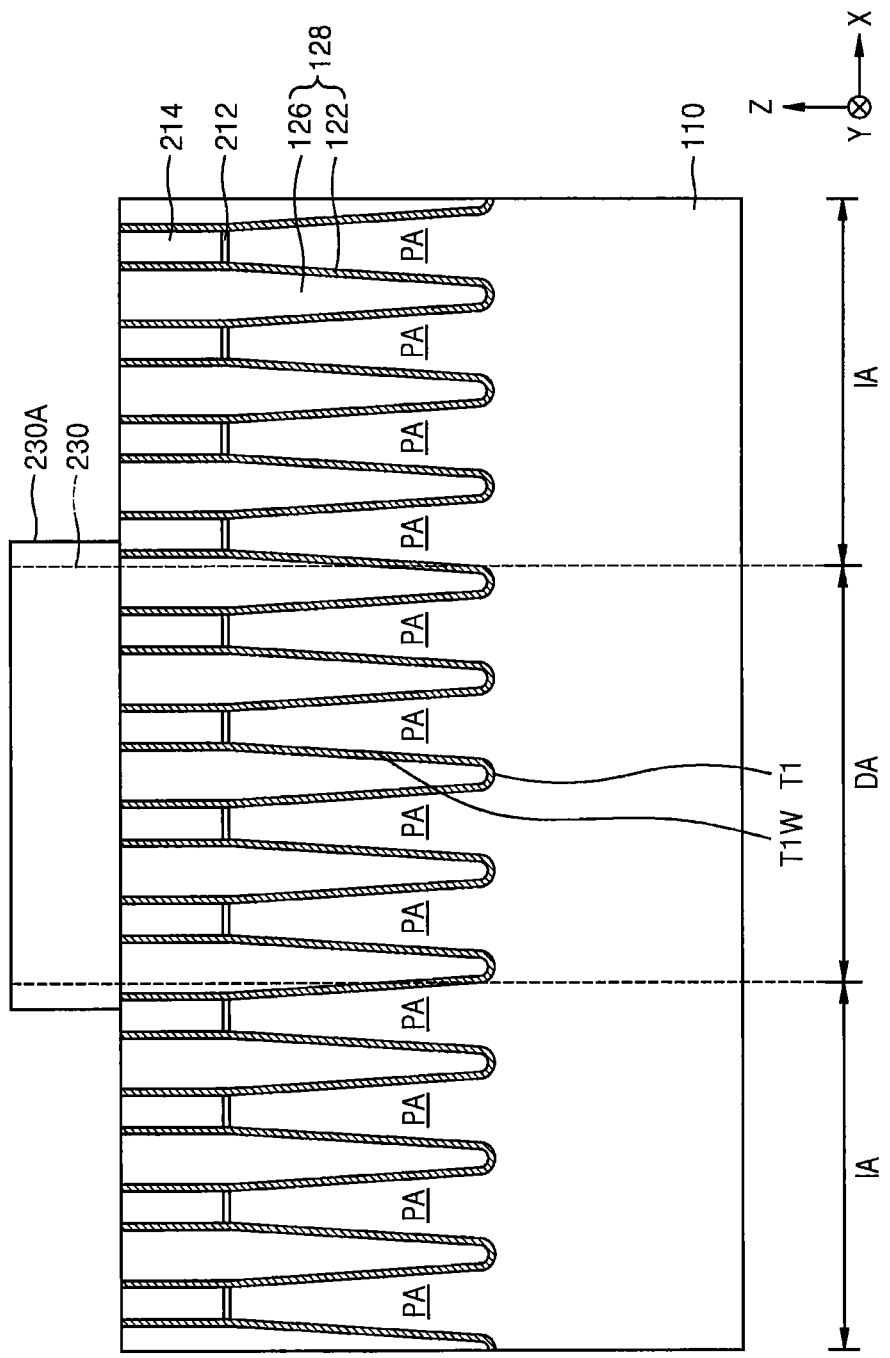

Referring to FIG. 13E, a mask pattern 230 may be formed on a structure in which the inner isolation layers 128 fill spaces between the plurality of preliminary fin-type active regions PA.

The mask pattern 230 may be formed in the device region DA to cover a desired number of preliminary fin-type active regions PA. For example, as illustrated in FIG. 13E, the mask patterns 230 may be formed to fully cover four preliminary fin-type active regions PA.

In some embodiments, since errors in a variety of process parameters such as line edge roughness (LER), critical dimension uniformity (CDE), overlay, or optical proximity effect, etc. that are generated during the process of forming the mask pattern 230 can occur, a desired position and size of the mask pattern 230 may be slightly varied on the substrate 110 in a case in which a minimum process margin to be secured is greater than a predetermined value. For example, in a case in which the process margin is similar to or greater than a distance between the plurality of preliminary fin-type active regions PA, for example, a distance between bottom portions of the plurality of preliminary fin-type active regions PA, instead of the desired mask pattern 230, a mask pattern that covers a portion of the preliminary fin-type active region PA outside the device region DA or extends very closely to at least one preliminary fin-type active region PA outside the device region DA may be formed on the substrate 110. As a result, as shown by a dotted line in FIG. 13E, the actual mask pattern 230A formed on a region shifted and/or extended from a desired position may be obtained. The actual mask pattern 230A may be formed to be positioned very closely to at least one preliminary fin-type active region PA outside the device region DA.

The actual mask pattern 230A may be enlarged to have a larger width at opposite sides of the desired mask pattern 230 in ±X directions as shown in FIG. 13E, but is not limited thereto. For example, the actual mask pattern 230A may be enlarged or shifted from the desired mask pattern 230 to have a larger width in either of the ±X directions.

The case in which a following process using the actual mask pattern 230A is performed is described as an example.

Figure 13F:
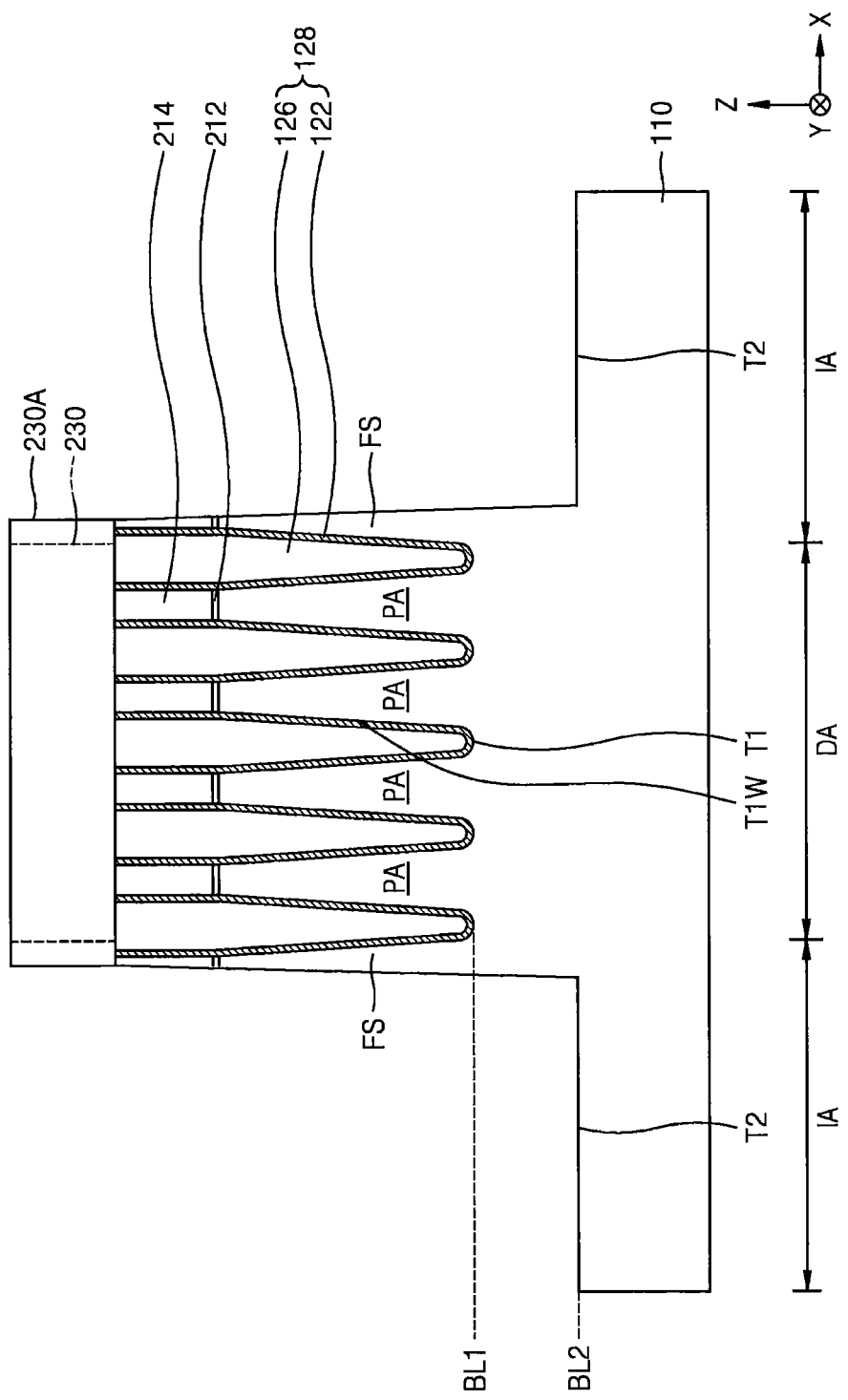

Referring to FIG. 13F, using the actual mask pattern 230A, the pad oxide pattern 212 and the first mask pattern 214 exposed by the actual mask pattern 230A may be removed, and then the inner isolation layer 128, the preliminary fin-type active regions PA and the substrate 110 may be etched to form an outer trench T2 exposing the substrate 110 in the inter-device isolation region IA.

A bottom surface level BL2 of the outer trench T2 may be lower than the bottom surface level BL1 of the plurality of inner trenches T1 (i.e., a depth of the outer trench T2 may be greater than a depth of the plurality of inner trenches T1), but the present disclosure is not limited thereto. For example, the bottom surface level BL2 of the outer trench T2 may be substantially equal to or similar to the bottom surface level BL1 of the plurality of inner trenches T1 (i.e., a depth of the outer trench T2 may be similar to or the same as a depth of plurality of inner trenches T1).

After forming the outer trench T2, a portion of the other preliminary fin-type active region PA that is adjacent to the device region DA and is etch-damaged may remain in a form of a fin-type sliver FS around the device region DA. As a result, the fin-type sliver FS may be exposed at an inner sidewall of the outer trench T2.

Figure 13G:
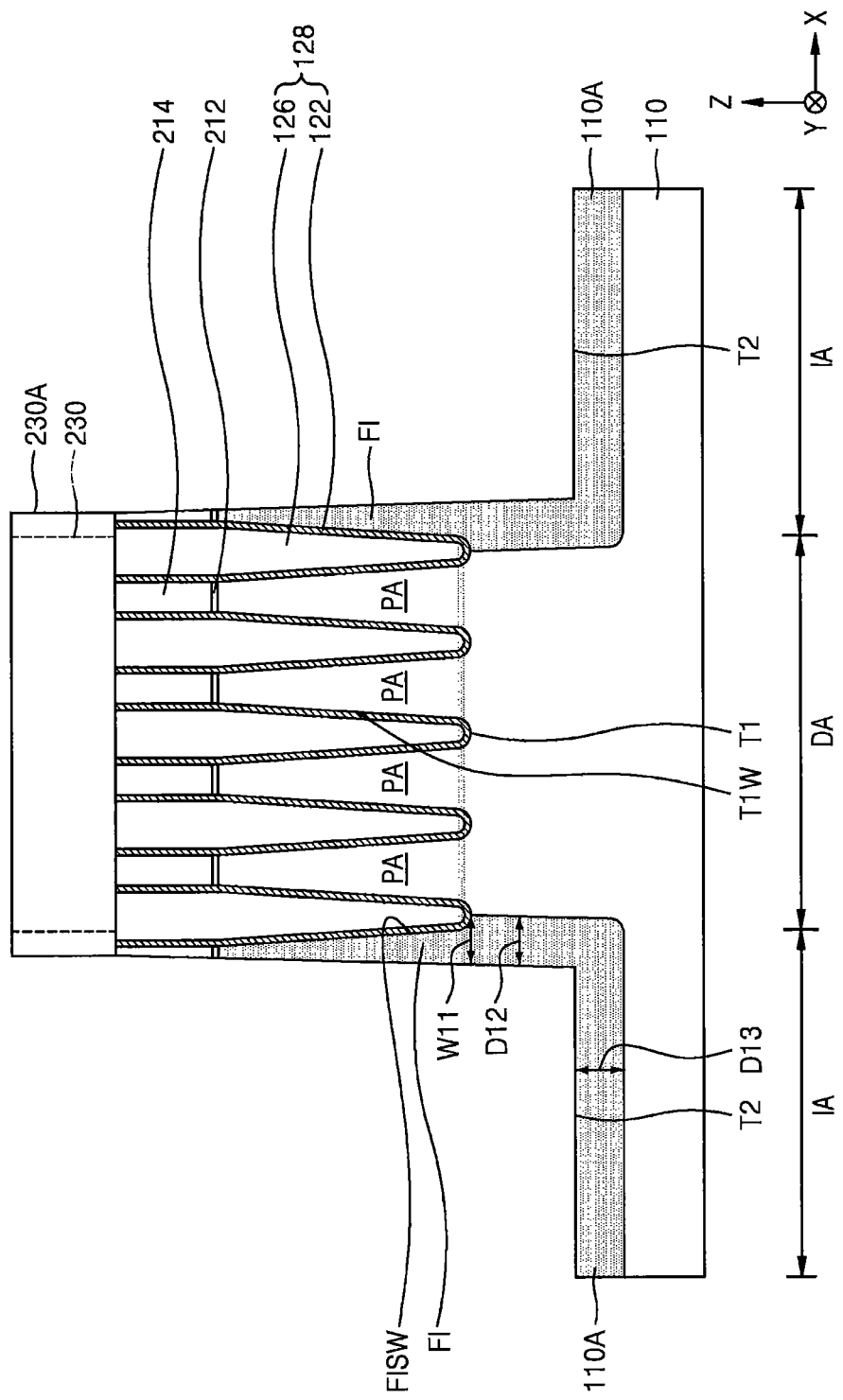

Referring to FIG. 13G, the fin-type sliver FS may be converted into a fin-type insulating part FI.

In some embodiments, the fin-type sliver FS may be converted into the fin-type insulating part FI using an oxidizing atmosphere. In some embodiments, the fin-type sliver FS may be converted into the fin-type insulating part FI using a nitriding atmosphere.

While converting the fin-type sliver FS into the fin-type insulating part FI, a portion of the substrate 110 exposed by the outer trench T2 may be converted into a lower insulating part 110A. The lower insulating part 110A may be integrally connected to the fin-type insulating part FI and may have a shape extending along a surface of the substrate 110.

The process of converting the fin-type sliver FS into the fin-type insulating part FI may be performed for enough time to entirely convert the fin-type sliver FS into the fin-type insluting part FI. While converting the fin-type sliver FS into the fin-type insulating part FI, the insulating liner 122 of the inner isolation layer 128 facing the fin-type sliver FS may be used as a converting stop layer.

As an example, the insulating liner 122 may include a silicon nitride layer, and the fin-type sliver FS may be converted into the fin-type insulating part FI using the oxidizing atmosphere. In this case, the fin-type sliver FS may be oxidized using the silicon nitride layer included in the insulating liner 122 as an oxidation stop layer such that the fin-type insulating part FI is formed of oxide. Further, the portion of the substrate 110 exposed by the outer trench T2 may be converted into the lower insulating part 110A formed of an oxide layer.

While oxidizing the fin-type sliver FS, the oxidation process may be performed during enough time to oxidize substantially an entire portion of the fin-type sliver FS. As a result, a portion of the substrate 110 without the insulating liner 122 may be oxidized by a thicker thickness D12 than a width of the fin-shaped sliver FS. In addition, a thickness D13 in the Z direction, of the lower insulating part 110A formed on the inner surface of the outer trench T2 may be greater than a maximum thickness of the fin-type insulating part FI (i.e., a width W11 of a bottom portion of the fin-type insulating part FI in the X direction).

The fin-type insulating part FI may contact a sidewall of the inner isolation layer 128 located at an outermost side of the device region DA among the plurality of inner isolation layers 128 and may extend parallel to the preliminary fin-type active region PA. The fin-type insulating part FI may directly contact the insulating liner 122 of the outermost inner isolation layer 128 in the device region DA and may have a width in the X direction increasing closer to the substrate 110.

The fin-type insulating part FI may have a smaller width W11 than a width of the preliminary fin-type active region PA in the X direction.

The fin-type insulating part FI may have a sloped sidewall FISW that contacts the sidewall of the inner isolation layer 128 located at an outermost side of the device region DA. As the sloped sidewall FISW is closer to the substrate 110, the sloped sidewall FISW may be inclined in a positive (+) direction or a negative (−) direction relative to a vertical line on the substrate 110 such that a spaced distance from the preliminary fin-type active region PA is shorter.

In other embodiments, the insulating liner 122 may include a silicon oxide layer, and the nitriding atmosphere may be used to convert the fin-type sliver FS into the fin-type insulating part. In this case, the fin-type sliver FS may be nitrided using the silicon oxide layer as a nitridation stop layer such the fin-type insulating part FI is formed of nitride. Further, a portion of substrate 110 exposed by the outer trench T2 may be converted into the lower insulating part 110A formed of a nitride layer.

In some embodiments, in order to convert the fin-type sliver FS into the fin-type insulating part FI using the oxidizing atmosphere, a plasma oxidation process may be used. For example, the fin-type sliver FS may be converted into an oxide layer using a plasma atmosphere in a plasma processing apparatus. As an example, the plasma oxidation process may be performed under the plasma atmosphere obtained using an $O_2$ gas and an inert gas. As other example, the plasmas oxidation may be performed in the plasma atmosphere obtained using an $O_2$ gas, an inert gas and a $H_2$ gas. To form the plasma atmosphere, the $O_2$ gas and an Ar gas may be supplied in the plasma processing apparatus, or, the $O_2$ gas, the Ar gas and the $H_2$ gas may be supplied in the plasma processing apparatus.

In order to convert the fin-type sliver FS into the fin-type insulating part FI using the oxidation atmosphere, various types of plasma processing apparatuses may be used. For example, the oxidation process may be performed using a radial line slot antenna (RLSA) microwave plasma processing apparatus capable of generating a microwave plasma of a high density and a low electron temperature by generating plasma using a microwave introduced in a reactive chamber from a plane antenna having a plurality of slots (e.g., RLSA), a remote plasma processing apparatus, an inductively coupled plasma (ICP) processing apparatus, an electron cyclotron resonance (ECR) plasma processing apparatus, a surface reflection plasma processing apparatus, or a magnetron plasma processing apparatus.

In other embodiments, in order to convert the fin-type sliver FS into the fin-type insulating part FI using the nitriding atmosphere, a plasma nitridation process may be used. For example, the fin-type sliver FS may be converted into a nitride layer using a plasma atmosphere in a plasma processing apparatus. As an example, the plasma nitridation process may be performed under a nitrogen-containing gas atmosphere. For example, the nitrogen-containing gas may include an $NH_3$ gas, but the present disclosure is not limited thereto.

Since the fin-type insulating part FI is formed by converting the fin-type sliver FS obtained from the preliminary fin-type active region PA by the oxidation or nitridation process, the fin-type insulating part FI and the lower insulating part 110A may include the same substance as a substance constituting the preliminary fin-type active region PA in the device region DA. For example, in the case in which the preliminary fin-type active region PA includes silicon, the fin-type insulating part FI and lower insulating part 110A may include silicon oxide or silicon nitride.

Figure 13H:
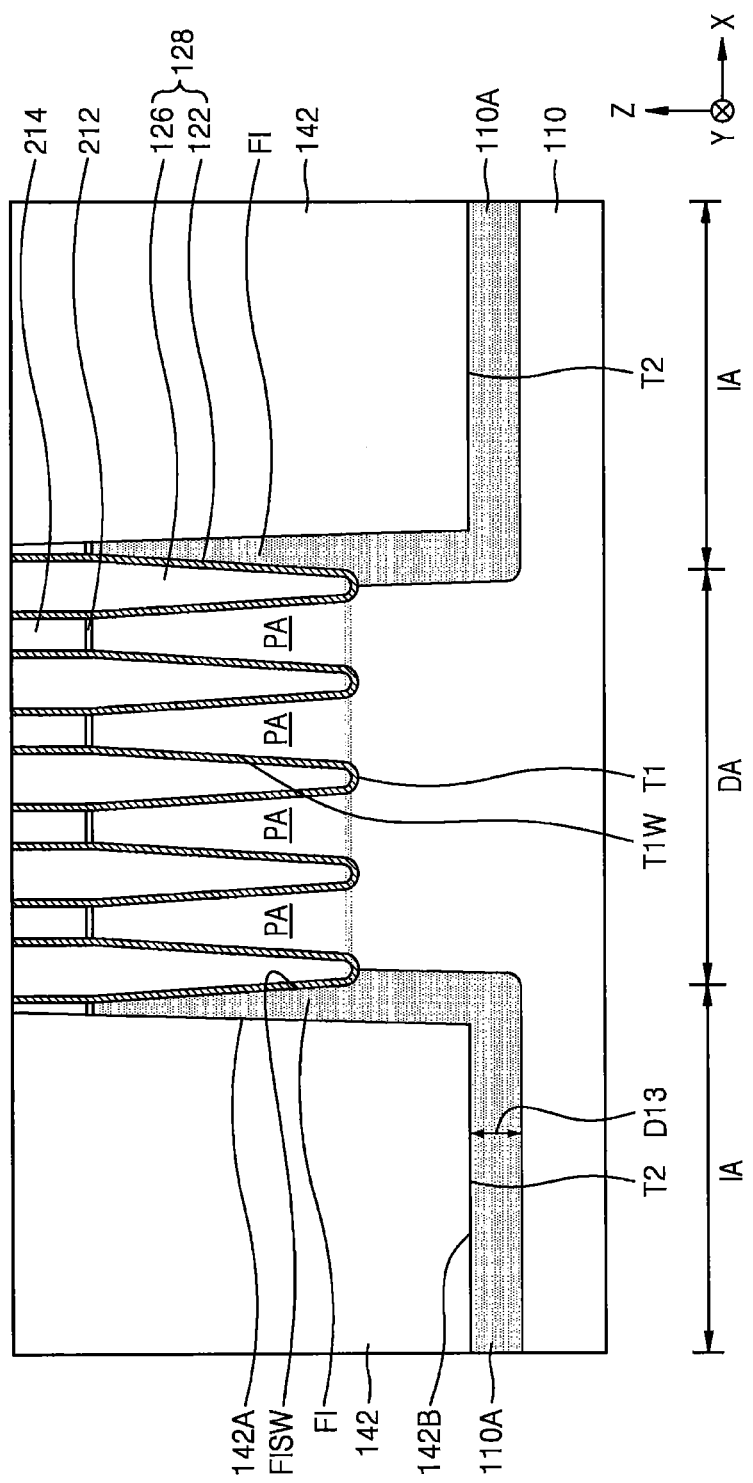

Referring to FIG. 13H, after the actual mask pattern 230A (refer to FIG. 13G) is removed, an outer gap-fill insulating layer 142 may be formed to fill the outer trench T2.

The outer gap-fill insulating layer 142 may be formed on the lower insulating part 110A to fill the outer trench T2 in the inter-device isolation region IA. The outer gap-fill insulating layer 142 may be formed to cover the sidewall of the fin-type insulating part FI.

In some embodiments, the outer gap-fill insulating layer 142 may be formed of a different material from a material constituting the fin-type insulating part FI and the lower insulating part 110A. In other embodiments, the outer-gap fill insulating layer 142 may be formed of the same material as a material constituting the fin-type insulating part FI and the lower insulating part 110A. In this case, the outer-gap fill insulating layer 142 and the fin-type insulating part FI may be distinguished by an interface 142A, and the outer-gap fill insulating layer 142 and the lower insulating part 110A may also be distinguished by the interface 142B.

In some embodiments, the outer gap-fill insulating layer 142 may be formed by a coating process or a deposition process. In some embodiments, the outer gap-fill insulating layer 142 may be formed of FSG, USG, BPSG, PSG, FOX, PE-TEOS, TOSZ or a combination thereof, but the present disclosure is not limited thereto.

In some embodiments, the outer gap-fill insulating layer 142 may be formed by forming an insulating layer filling the outer trench T2 and planarizing the insulating layer to expose the plurality of first mask patterns 214. In this case, a portion of the plurality of first mask patterns 214 and a portion of the inner isolation layers 128 may be consumed such that heights thereof may be reduced.

Figure 13I:
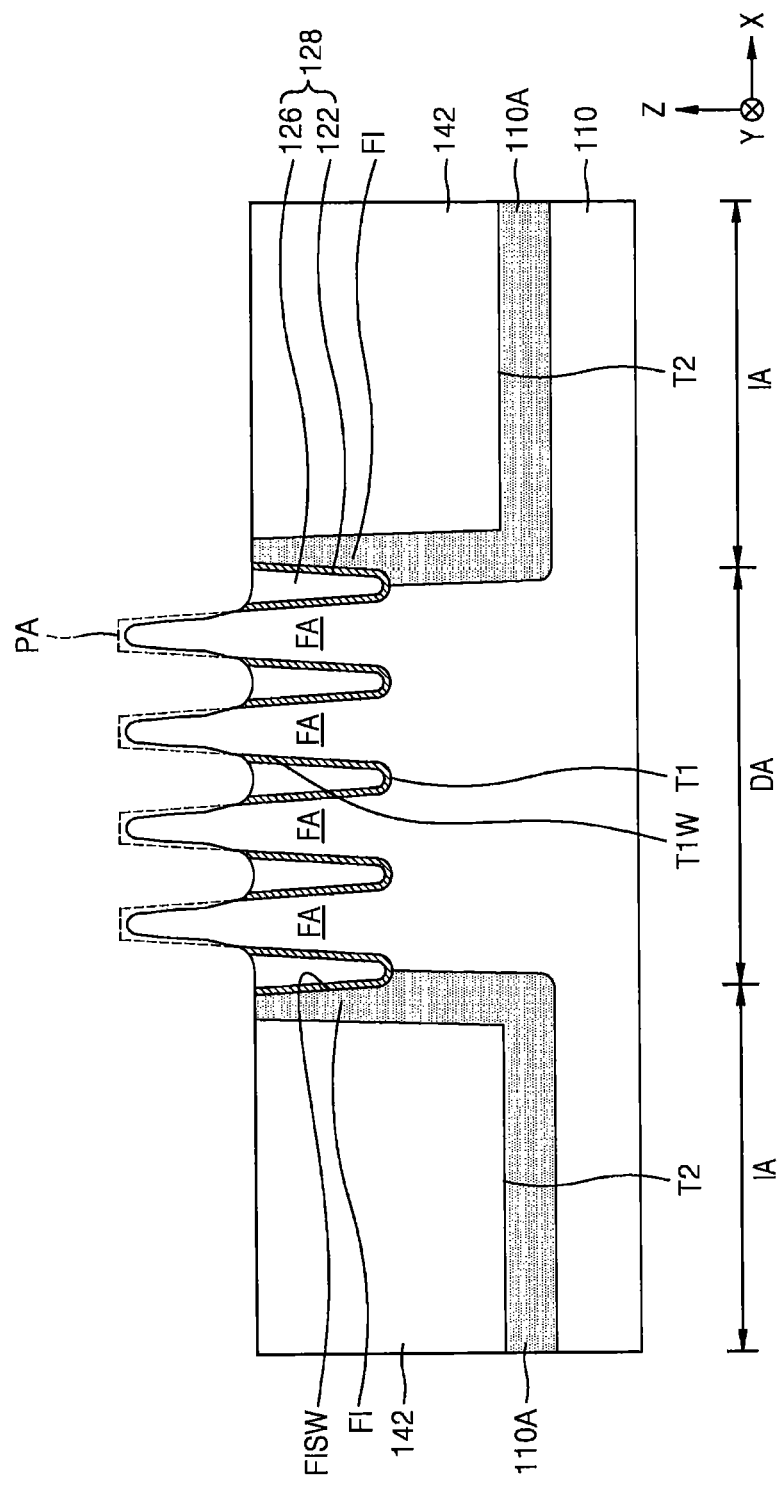

Referring to FIG. 13I, after the plurality of first mask patterns 214 and the plurality of pad oxide patterns 212 (refer to FIG. 13H) are removed, a recess process of removing a portion of the plurality of inner isolation layers 128 covering the plurality of preliminary fin-type active regions PA, a portion of the fin-type insulating part FI and a portion of the outer gap-fill insulating layer 142 may be performed.

As a result, a plurality of fin-type active regions FA may be formed from the plurality of preliminary fin-type active regions PA, and an upper portion of each of plurality of fin-type active regions FA may be exposed and may protrude above the inner isolation layer 128.

In some embodiments, the recess process may be performed by a wet etch process, a dry etch process or a combined process thereof. While performing the recess process, since upper portions of the plurality of preliminary fin-type active regions PA are exposed under an etching atmosphere and/or a subsequent cleaning atmosphere, the upper portions of the plurality of preliminary fin-type active regions PA may be partially consumed by etching, oxidation and/or cleaning. Accordingly, as illustrated in FIG. 13I, the plurality of fin-type active regions FA of which each has a reduced upper width may be formed from the plurality of preliminary fin-type active regions PA. Specifically, while performing the recess process on a resulting structure of FIG. 13H, as a removal amount of unnecessary layers in the device region DA and the inter-device isolation region IA is increased, an exposed area of the plurality of preliminary fin-type active regions PA may be increased, and thus top portions of the plurality of preliminary fin-type active regions PA may be exposed for a longer time in compared to lower portions thereof under the etching atmosphere of the recess process. Accordingly, a consumed amount of the plurality of preliminary fin-type active regions PA due to the etching atmosphere is increased closer to the top portion thereof. As a result, the plurality of fin-type active regions FA may have a width decreasing closer to the top portion thereof.

In some embodiments, threshold voltage control impurity ions may injected into the exposed upper portions of the plurality of fin-type active regions FA in the device region DA. In the case in which an NMOS transistor is formed in the device region DA, boron (B) ions as the threshold voltage control impurity ions may be injected. In the case in which a PMOS transistor is formed in the device region DA, phosphorus (P) ions or arsenic (As) as the threshold voltage control impurity ions may be injected.

Figure 13J:
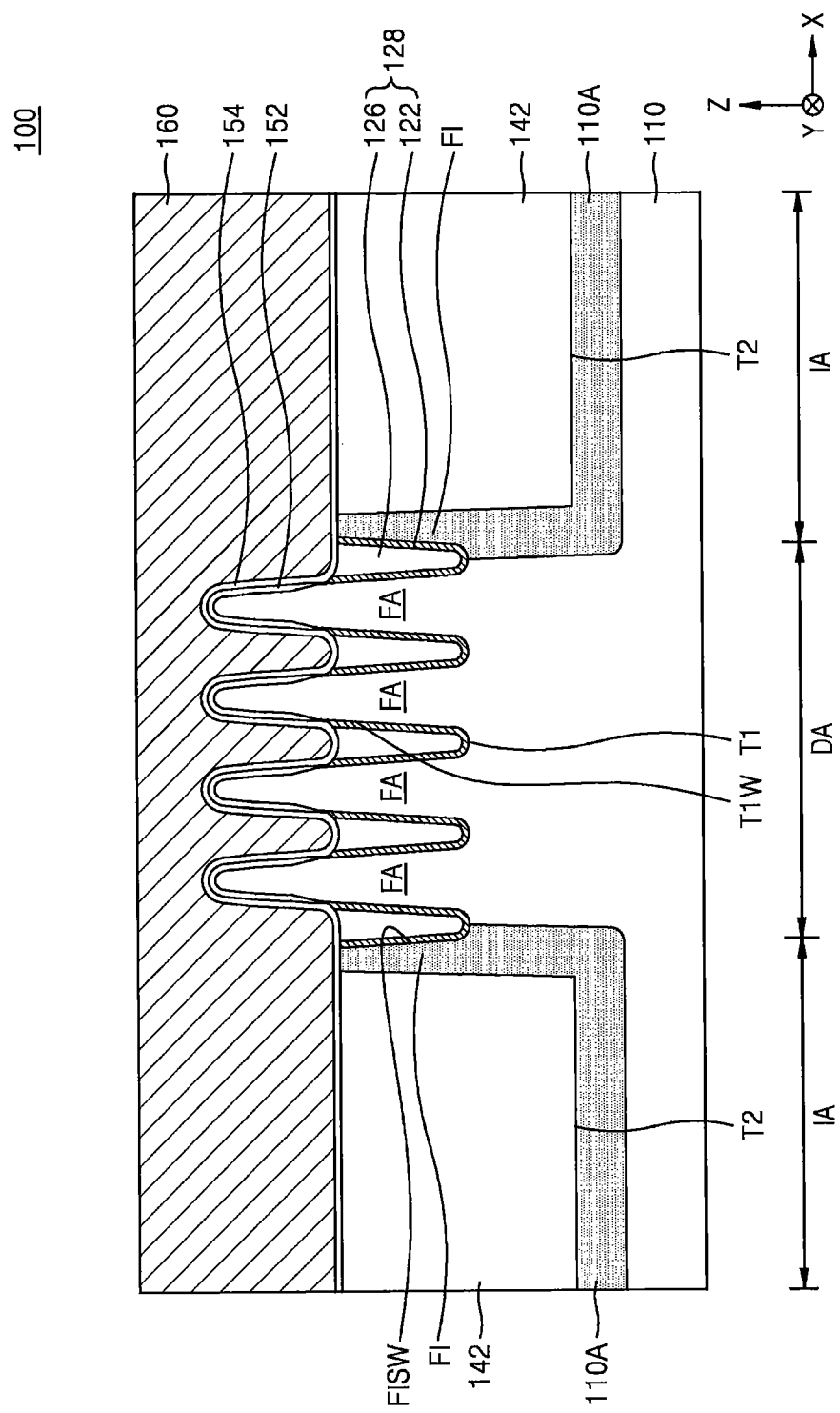

Referring to FIG. 13J, an interface layer 152 may be formed on the exposed surfaces of the plurality of fin-type active regions FA, and a gate insulating layer 154 and a gate line 160 may be sequentially formed on the interface layer 152.

The interface layer 152 may be formed by oxidizing the exposed surfaces of the plurality of fin-type active regions FA. In some embodiments, the interface layer 152 may be formed of a low-k dielectric layer of which a dielectric constant is about 9 or less, for example, a silicon oxide layer, a silicon oxynitride layer or a combination thereof. In other embodiments, the interface layer 152 may be formed of a silicate layer, a combination of a silicate layer and a silicon oxide layer, or a combination of a silicate layer and a silicon oxynitirde layer. The interface layer 152 may have a thickness of about 5 to 20 Å, but the present disclosure is not limited thereto. In some embodiments, the process of forming the interface layer 152 may be omitted.

The gate insulating layer 154 and the gate line 160 may be formed on the plurality of fin-type active regions FA to cover opposite sidewalls and a top surface of each of the plurality of fin-type active regions FA.

The gate insulating layer 154 may be formed of a high-k dielectric layer of which a dielectric constant is higher than that of the interface layer 152. The gate insulating layer 154 may have a dielectric constant of about 10 to 25. The gate insulating layer 154 may include hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate or a combination thereof, but the present disclosure is not limited thereto. The gate insulating layer 154 may be formed by an atomic layer deposition (ALD) process, a chemical vapor deposition (CVD) process or a physical vapor deposition (PVD) process. The gate insulating layer 154 may have a thickness of about 10 to 40 Å, but the present disclosure is not limited thereto.

The gate line 160 may include a work function adjustment metal-containing layer and a gap-fill metal-containing layer filling spaces formed on the work function adjustment metal-containing layer. In some embodiments, the gate line 160 may have a structure in which a metal nitride layer, a metal layer, a conductive capping layer and a gap-fill metal layer are sequentially stacked. The metal nitride layer and the metal layer may each include at least one of Ti, W, Ru, Nb, Mo, Hf, Ni, Co, Pt, Yb, Tb, Dy, Er and Pd. The metal nitride layer and the metal layer may be formed by an ALD process, a metal organic ALD process or a metal organic CVD process. The conductive capping layer may act as a protecting layer to prevent a surface of the metal layer from being oxidized. Further, the conductive capping layer may act as a wetting layer for facilitating the deposition of another metal layer on the metal layer. The conductive capping layer may include metal nitride, for example, TiN, TaN or a combination thereof, but the present disclosure is not limited thereto. The gap-fill metal layer may extend on the conductive capping layer. The gap-fill metal layer may formed by an ALD process, a CVD process or a PVD process. The gap-fill metal layer may fill a recess space formed by a step between regions of a surface of the conductive capping layer without a void. In some embodiments, the gate line 160 may include a stack structure of TiAlC/TiN/W, a stack structure of TiN/TaN/TiAlC/TiN/W or a stack structure of TiN/TaN/TiN/TiAlC/TiN/W. In this case, the TiAlC layer or the TiN layer may act as the work function adjustment metal-containing layer.

In some embodiments, the gate line 160 may be formed by a replacement poly-gate (RPG) process. In an example process of forming the gate line 160, a plurality of sacrificial patterns of which each is formed of a stack structure of a sacrificial gate insulating layer and a sacrificial gate pattern may be formed on the plurality of fin-type active regions FA. The sacrificial gate insulating layer may be formed of a silicon oxide layer, and the sacrificial pattern may be formed of polysilicon.

Next, insulating spacers covering opposite sidewalls of each of the plurality of sacrificial patterns and an inter-gate insulating layer on the insulating spacers may be formed. After a plurality of gate spaces exposing the surfaces of the plurality fin-type active regions FA are formed by removing the plurality of sacrificial patterns, the interface layer 152, the gate insulating layer 154 and the gate line 160 may be sequentially formed in the plurality of gate spaces.

A plurality of source/drain regions may be formed on the plurality of fin-type active regions FA before or after forming the gate line 160. In an example process of forming the plurality of source/drain regions, after the plurality of fin-type active regions are partially etched to form a plurality of recess regions, semiconductor layers may be formed to fill the plurality of recess regions by an epitaxial growth process. The plurality of source/drain regions may be formed of a SiGe layer, a Si layer or a SiC layer that is epitaxially grown in the plurality of recess regions on the plurality of fin-type active regions FA.

In the method of manufacturing the integrated circuit device according to the example embodiment of the present disclosure as described with reference to FIGS. 13A to 13J, even if the errors in the process parameters occurs during the manufacturing process, a possibility that various defects or failures may occur due to an unnecessary fin-type active region remaining around the device region can be eliminated. Accordingly, in the method of manufacturing the integrated circuit device with a tight design-rule, even if a portion of the active regions is damaged due to a lack of a process margin depending on a small pitch of the active regions, defects or failures can be reduced or prevented from occurring by a simple method without increasing a process difficulty.

FIGS. 14A to 14D are cross-sectional views illustrating stages of a method of manufacturing an integrated circuit device according to an example embodiment. With reference to FIGS. 14A to 14D, an example method of manufacturing the integrated circuit device 200 illustrated in FIG. 2 is described. In FIGS. 14A to 14D, the same reference numerals denote the same elements as in FIGS. 1A to 13J, and detailed descriptions thereof are omitted here for brevity.

Figure 14A:
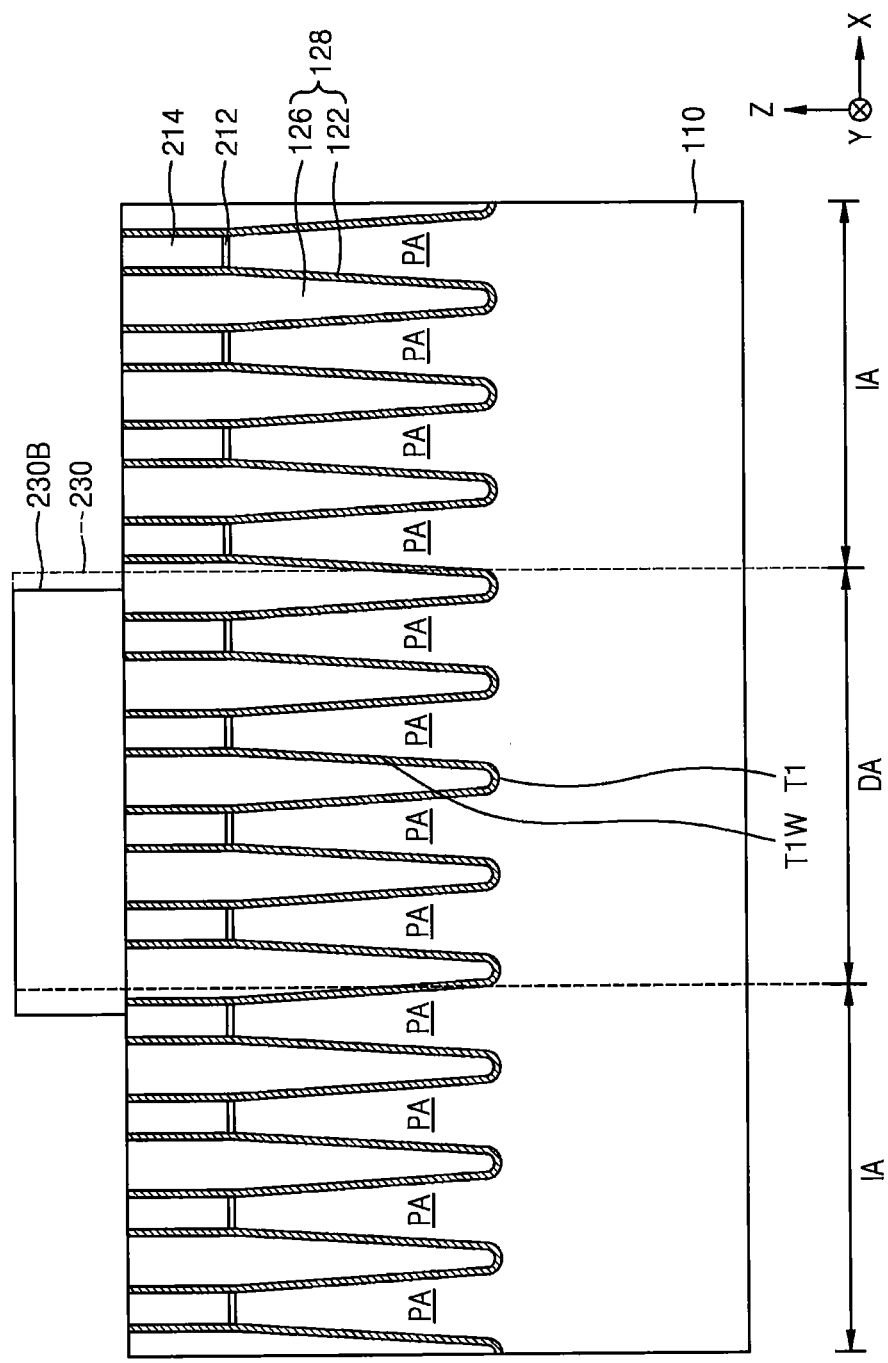
FIGS. 14A to 14D are cross-sectional views illustrating stages of a method of manufacturing an integrated circuit device according to an example embodiment.

Referring to FIG. 14A, processes as described with reference to FIGS. 13A to 13E may be performed such that a mask pattern 230 defining a device region DA may be formed on a structure in which an inner isolation layer 128 is formed to fill respective spaces between a plurality of preliminary fin-type active regions PA.

In the present example embodiment, in the process of forming the mask pattern 230, unlike the actual mask pattern 230A as illustrated in FIG. 13E, an actual mask pattern 230B shifted in a −X direction from the position of the desired mask pattern 230 may be formed.

Figure 14B:
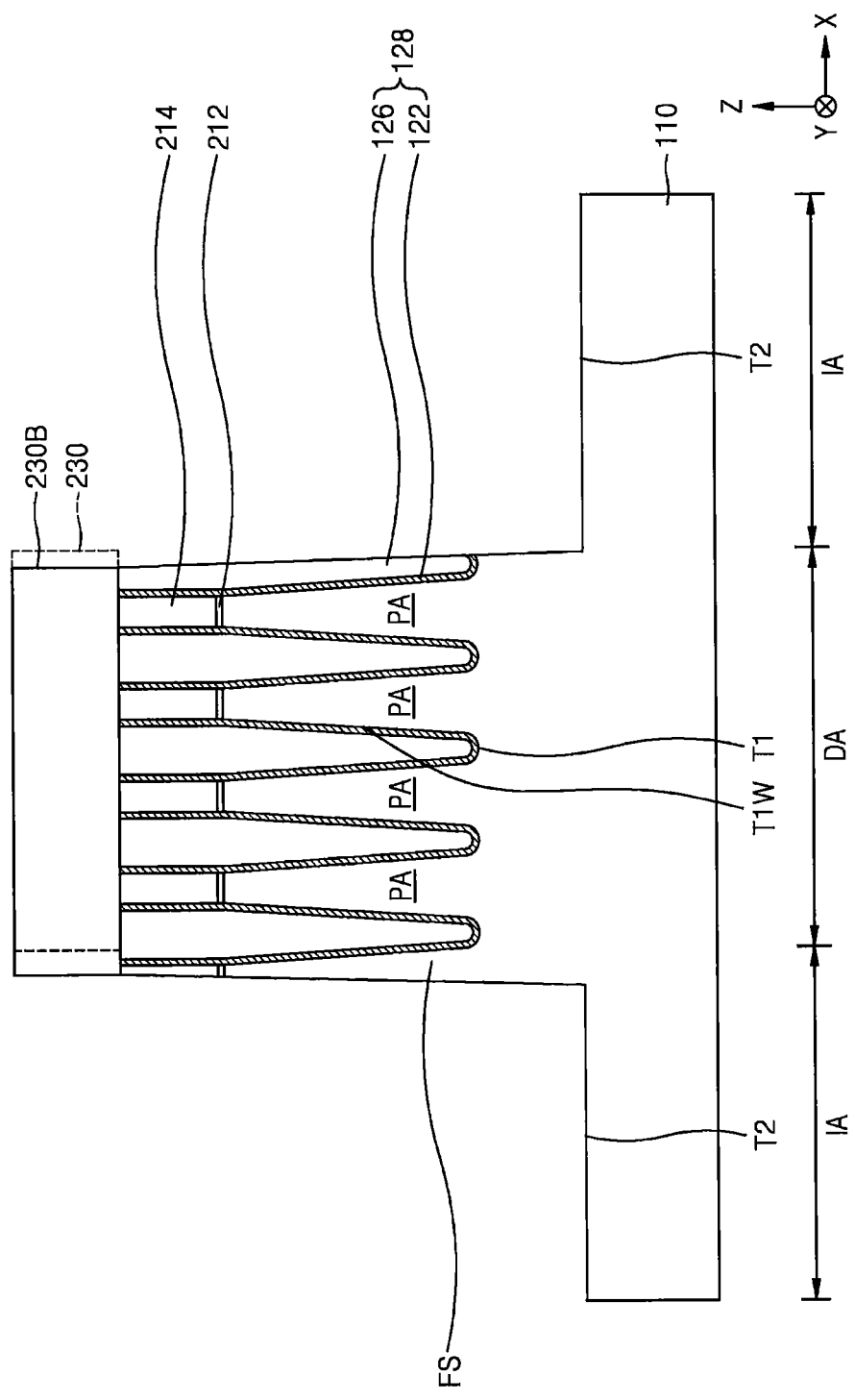

Referring to FIG. 14B, using the actual mask pattern 230B as an etch mask, a pad oxide pattern 212 and a first mask pattern 214 exposed by the actual mask pattern 230B may be removed by a similar process to that described with reference to FIG. 13F, and then the inner isolation layer 128, the preliminary fin-type active regions PA and a substrate 110 may be etched to form an outer trench T2 exposing the substrate 110 in an inter-device isolation region IA.

After forming the outer trench T2, another preliminary fin-type active region PA that is not included in the device region DA (i.e., the preliminary fin-type active region adjacent to the device region DA) may remain in a form of an etch-damaged fin-type sliver FS around the device region DA. In the present example, unlike the resulting structure illustrated in FIG. 13F, one damaged fin-type sliver FS may be formed on only one side of the device region DA to be exposed at an inner sidewall of the outer trench T2. At another side of the device region DA, the inner isolation layer 128 may be exposed at the inner sidewall of the outer trench T2.

Figure 14C:
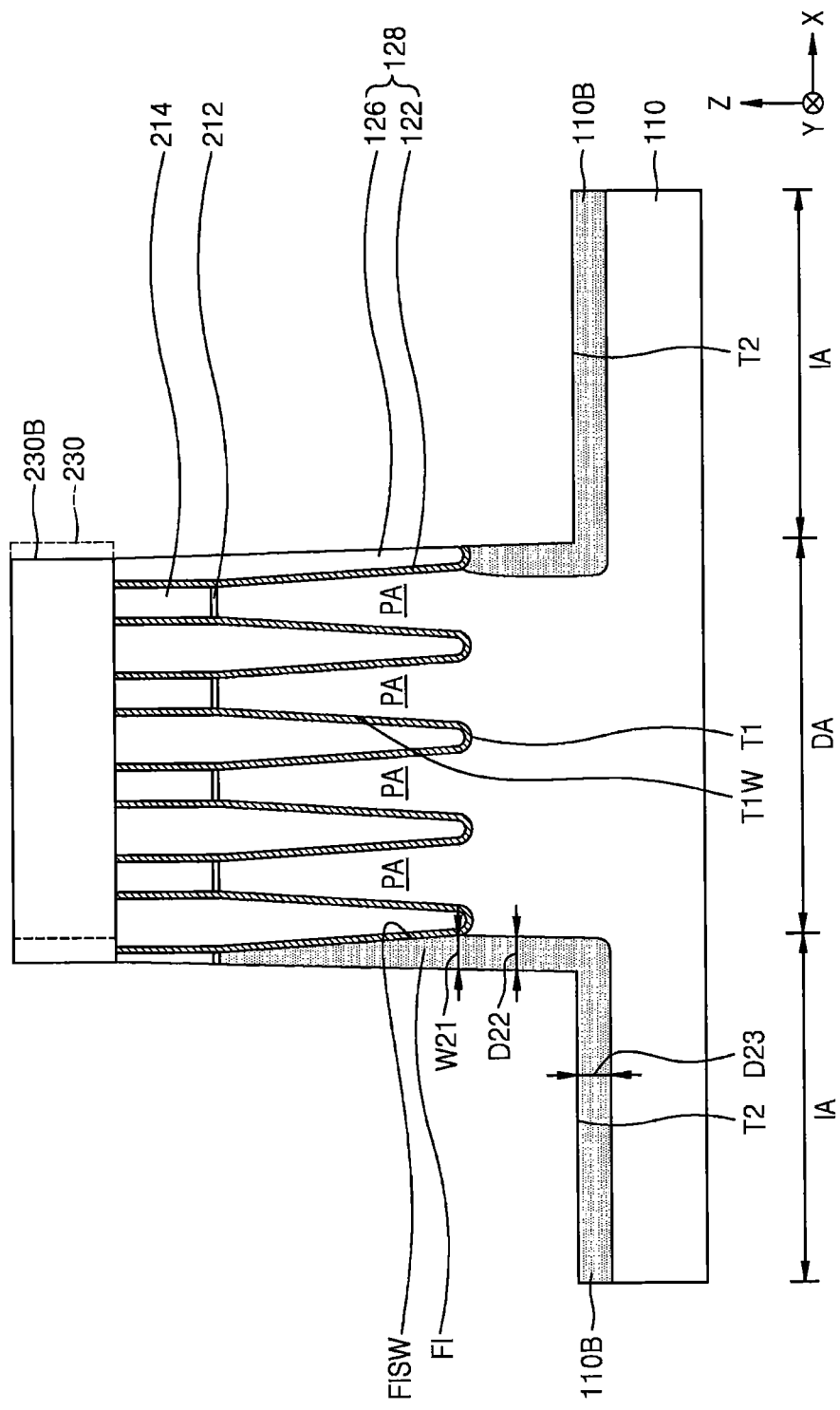

Referring to FIG. 14C, the fin-type sliver FS may be converted into a fin-type insulating part FI at the inner sidewall of the outer trench T2 by a similar process to or the same process as those described with reference to FIG. 13G. While converting the fin-type sliver FS into the fin-type insulating part FI, a portion of the substrate 110 exposed in the outer trench T2 may be converted into a lower insulating part 110B. At the one side of the device region DA, the lower insulating part 110B may be integrally connected to the fin-type insulating part FI and may have a shape extending along a surface of the substrate 110. At the another side of the device region DA, since the inner isolation layer 128 is exposed at the inner sidewall of the outer trench T2 and the damaged fin-type sliver does not exist, the fin-type insulating part FI may not be formed.

The process of converting the fin-type sliver FS into the fin-type insulating part FI may be performed using the insulating liner 122 of the inner isolation layer 128 as a converting stop layer. Accordingly, the fin-type insulating part FI may be formed and at the same time the lower insulating part 110B may be formed on the substrate 110 exposed in the outer trench T2.

In some embodiments, a thickness (e.g., a thickness D22 in a X direction and a thickness D23 in a Z direction as shown in FIG. 14C) of the lower insulating part 110B formed on the inner wall of the outer trench T2 may be equal to or greater than a maximum width of the fin-type insulating part FI (i.e., a width W21 of a bottom portion of the fin-type insulating part FI in the X direction).

Figure 14D:
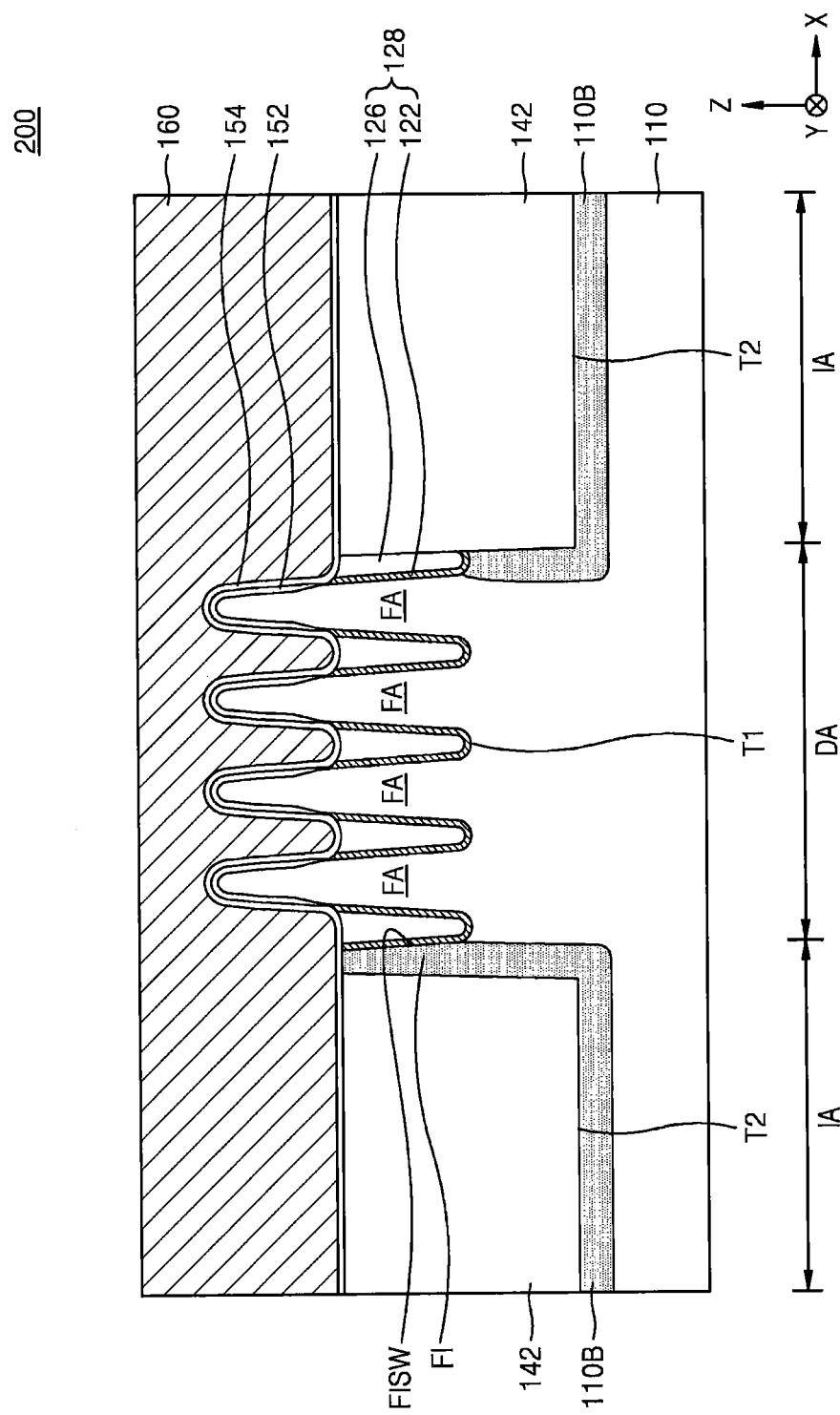

Referring to FIG. 14D, after the actual mask pattern 230B is removed from the resulting structure of FIG. 14C, processes similar to or the same as those described with reference to FIGS. 13H to 13J may be performed to form the integrated circuit device 200.

FIGS. 15A to 15D are cross-sectional views illustrating stages of a method of manufacturing an integrated circuit device according to an example embodiment. With reference to FIGS. 15A to 15D, an example method of manufacturing the integrated circuit device 300 illustrated in FIG. 3 is described.

In FIGS. 15A to 15D, the same reference numerals denote the same elements as in FIGS. 1A to 14D, and detailed descriptions thereof are omitted here for brevity.

Figure 15A:
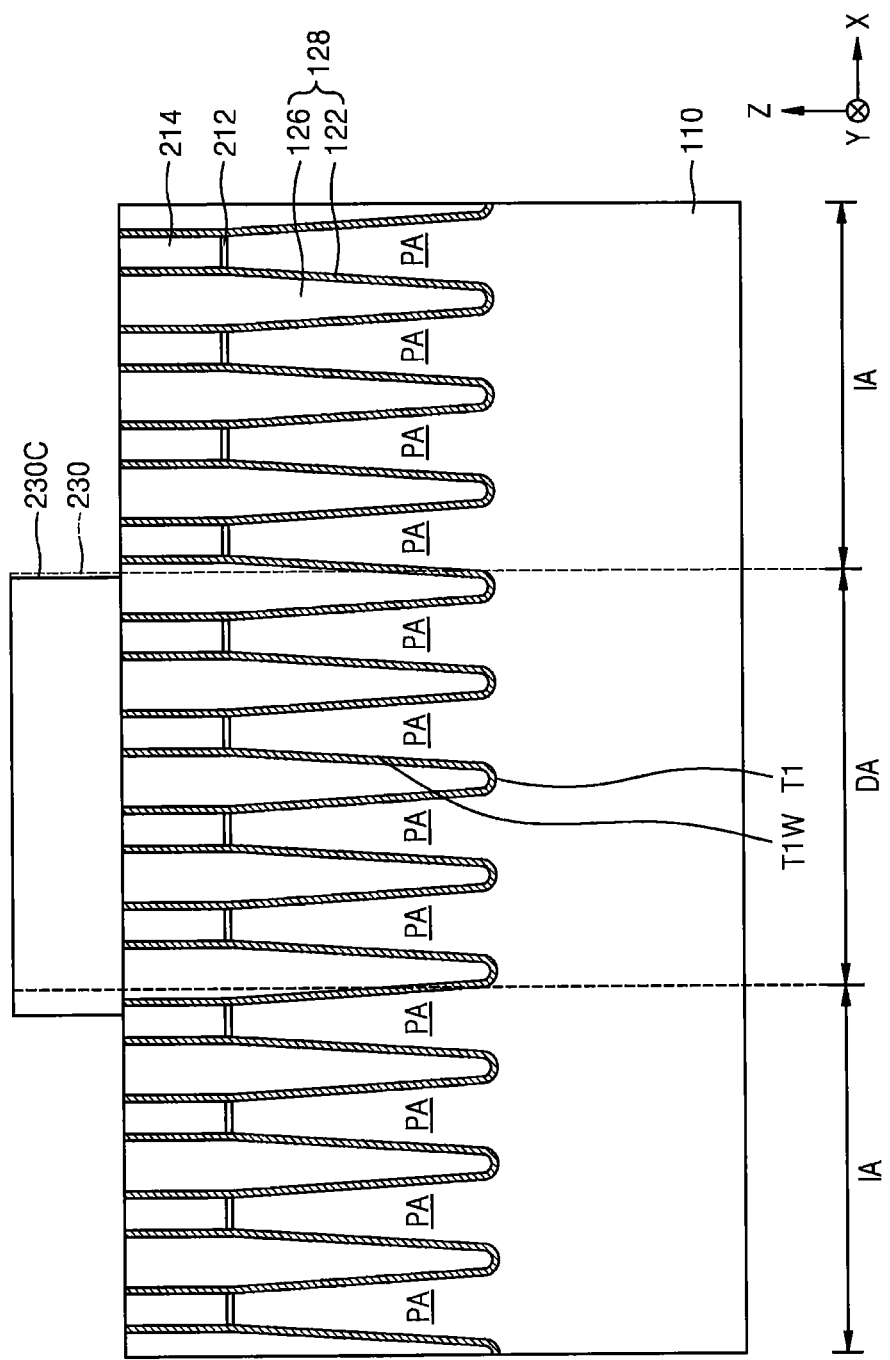
FIGS. 15A to 15D are cross-sectional views illustrating stages of a method of manufacturing an integrated circuit device according to an example embodiment.

Referring to FIG. 15A, processes as described with reference to FIGS. 13A to 13E may be performed such that a mask pattern 230 defining a device region DA may be formed on a structure in which an inner isolation layer 128 is formed to fill respective spaces between a plurality of preliminary fin-type active regions PA.

In the present example embodiment, in the process of forming the mask pattern 230, an actual mask pattern 230C shifted in a −X direction from the position of the desired mask pattern 230 may be formed.

Figure 15B:
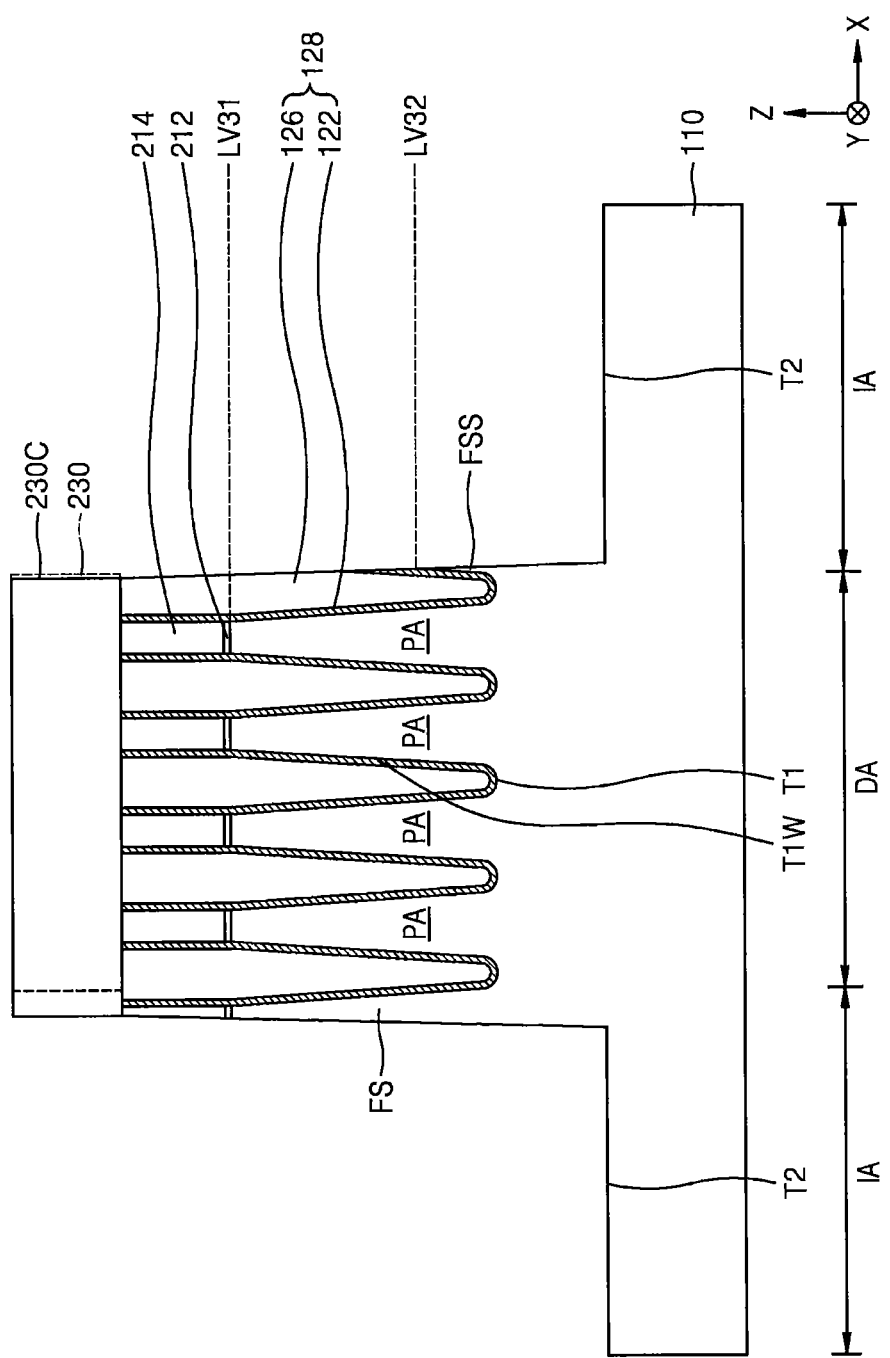

Referring to FIG. 15B, using the actual mask pattern 230B as an etch mask, a pad oxide pattern 212 and a first mask pattern 214 exposed by the actual mask pattern 230C may be removed by a similar process to that described with reference to FIG. 13F, and then the inner isolation layer 128, the preliminary fin-type active regions PA and a substrate 110 may be etched to form an outer trench T2 exposing the substrate 110 in an inter-device isolation region IA.

After forming the outer trench T2, the preliminary fin-type active region PA that is not included in the device region DA may remain in a form of an etch-damaged fin-type sliver FS around the device region DA. In the present example, similar to the resulting structure illustrated in FIG. 13F, damaged fin-type slivers FS and FSS may be formed on opposite sides of the device region DA. One fin-type sliver FS exposed in the outer trench T2 at a side of the device region DA may have a substantially similar upper surface level to an upper surface level LV31 of the preliminary fin-type active regions PA in the device region DA. At another side of the device region DA, one fin-type sliver FSS exposed in the outer trench T2 may have a lower height to have an upper surface level LV32 lower than the upper surface level LV31 of the preliminary fin-type active regions PA.

Figure 15C:
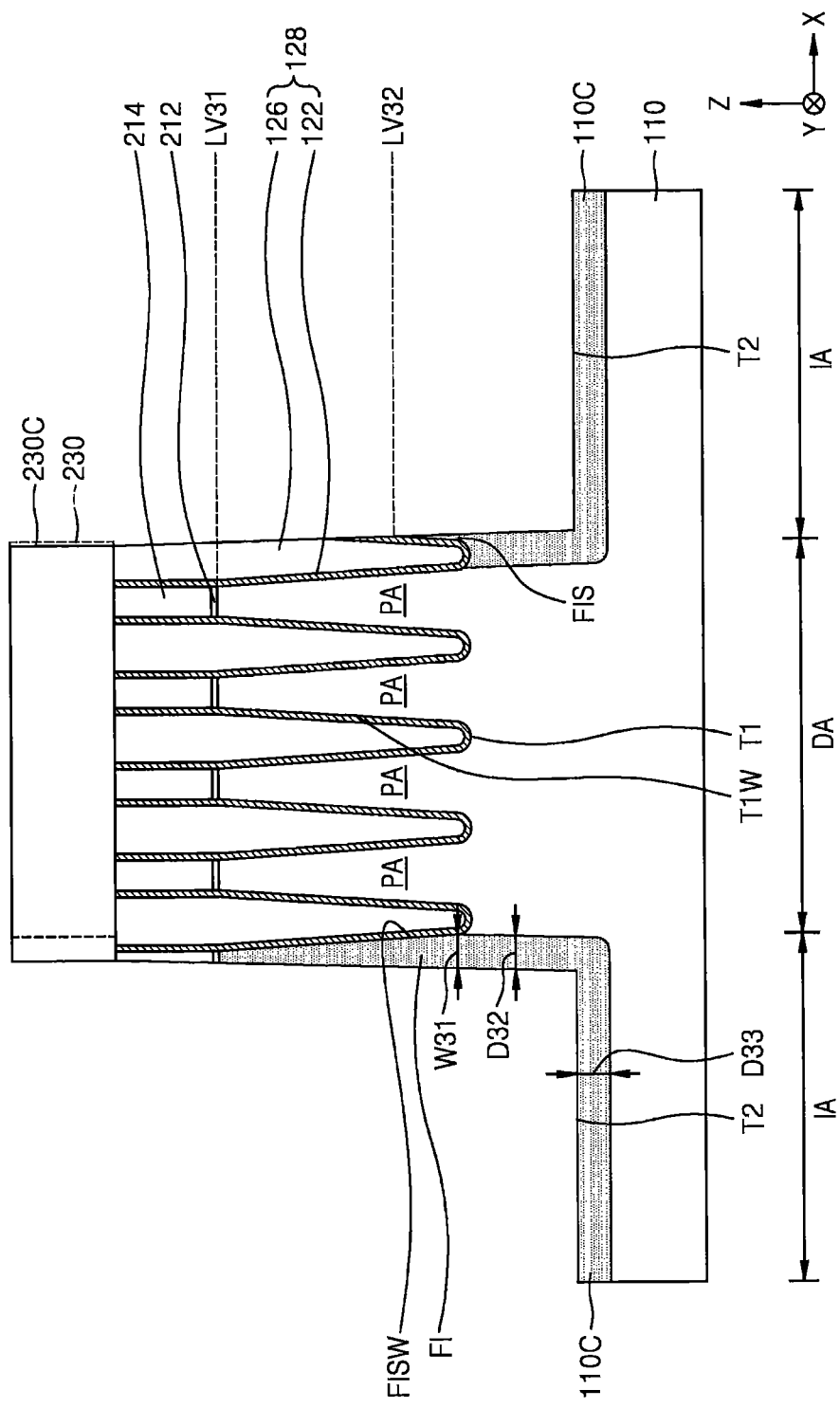

Referring to FIG. 15C, the fin-type slivers FS and FSS may be converted into fin-type insulating parts FI and FIS at the inner sidewall of the outer trench T2 by a similar process to or the same process as those described with reference to FIG. 13G. While converting the fin-type slivers FS and FSS into fin-type insulating parts FI and FIS, a portion of the substrate 110 exposed in the outer trench T2 may be converted into a lower insulating part 110C. At the opposite sides of the device region DA, the lower insulating part 110C may be integrally connected to the fin-type insulating parts FI and FIS and may have a shape extending along a surface of the substrate 110.

The process of converting the fin-type slivers FS and FSS into the fin-type insulating parts FI and FIS may be performed using the insulating liner 122 of the inner isolation layer 128 as a converting stop layer. Accordingly, the fin-type insulating parts FI and FIS may be formed and at the same time the lower insulating part 110C may be formed on the substrate 110 exposed in the outer trench T2.

In some embodiments, a thickness of the lower insulating part 110C formed on the inner wall of the outer trench T2 (e.g., a thickness D32 in a X direction and a thickness D33 in a Z direction as shown in FIG. 15C) may be equal to or greater than a maximum width of the fin-type insulating part FI (i.e., a width W31 of a bottom portion of the fin-type insulating part FI in the X direction).

Figure 15D:
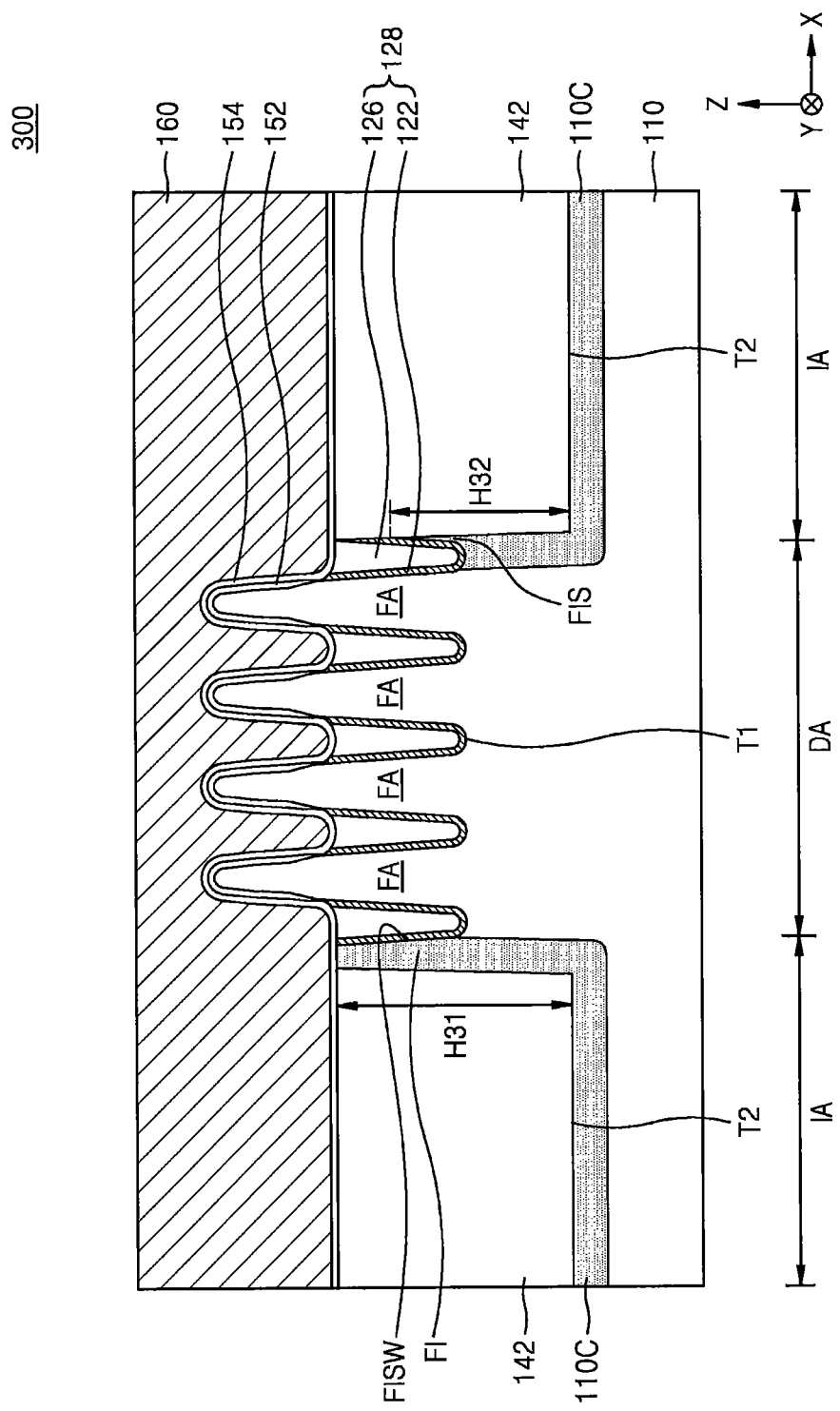

Referring to FIG. 15D, after the actual mask pattern 230C is removed from the resulting structure of FIG. 15C, processes similar to or the same as those described with reference to FIGS. 13H to 13J may be performed to form the integrated circuit device 300.

In the integrated circuit device 300, the fin-type insulating parts FI and FIS formed at the opposite sides of the device regions DA may have different heights and different widths from each other. For example, a height H31 from a bottom surface of the outer trench T2 to a top surface of the fin-type insulating part FI may be greater than a height H32 from the bottom surface of the outer trench T2 to the top surface of the fin-type insulating part FIS. Further, the width of the fin-type insulating part FI in the X direction may be greater than the width of the fin-type insulating part FIS in the X direction.

Figure 16A:
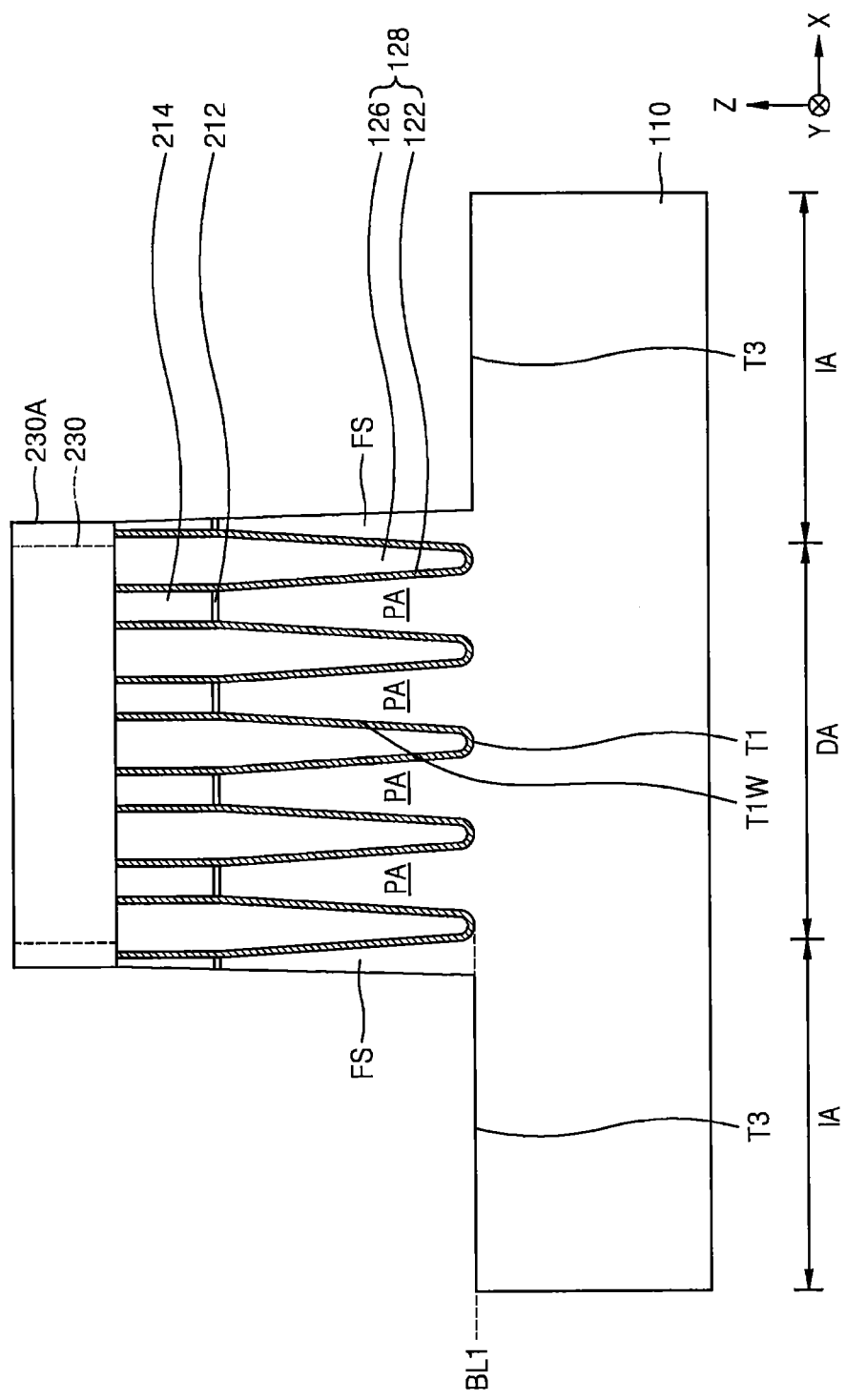
FIGS. 16A to 16C are cross-sectional views illustrating stages of a method of manufacturing an integrated circuit device according to an example embodiment.
Figure 16B:
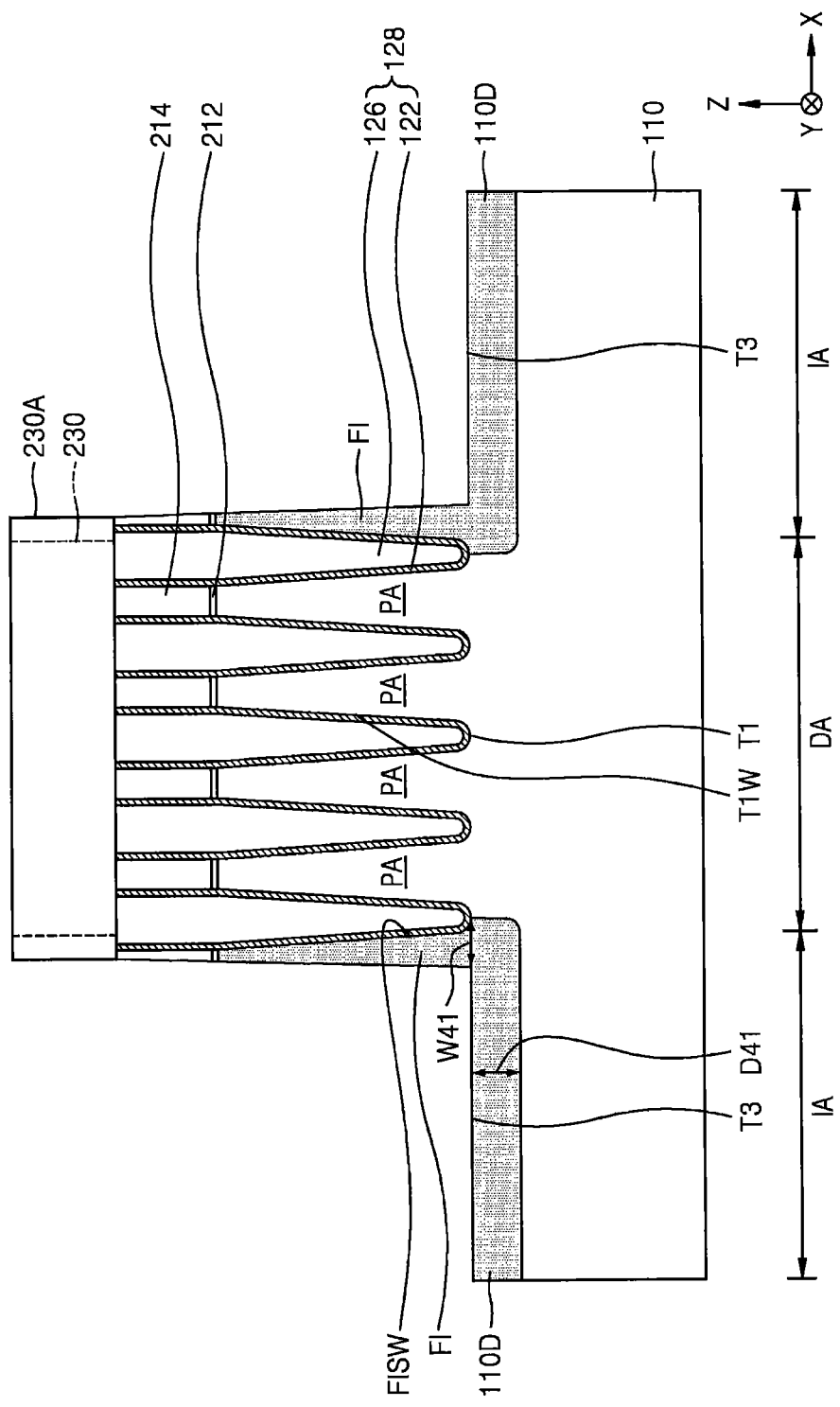
Figure 16C:
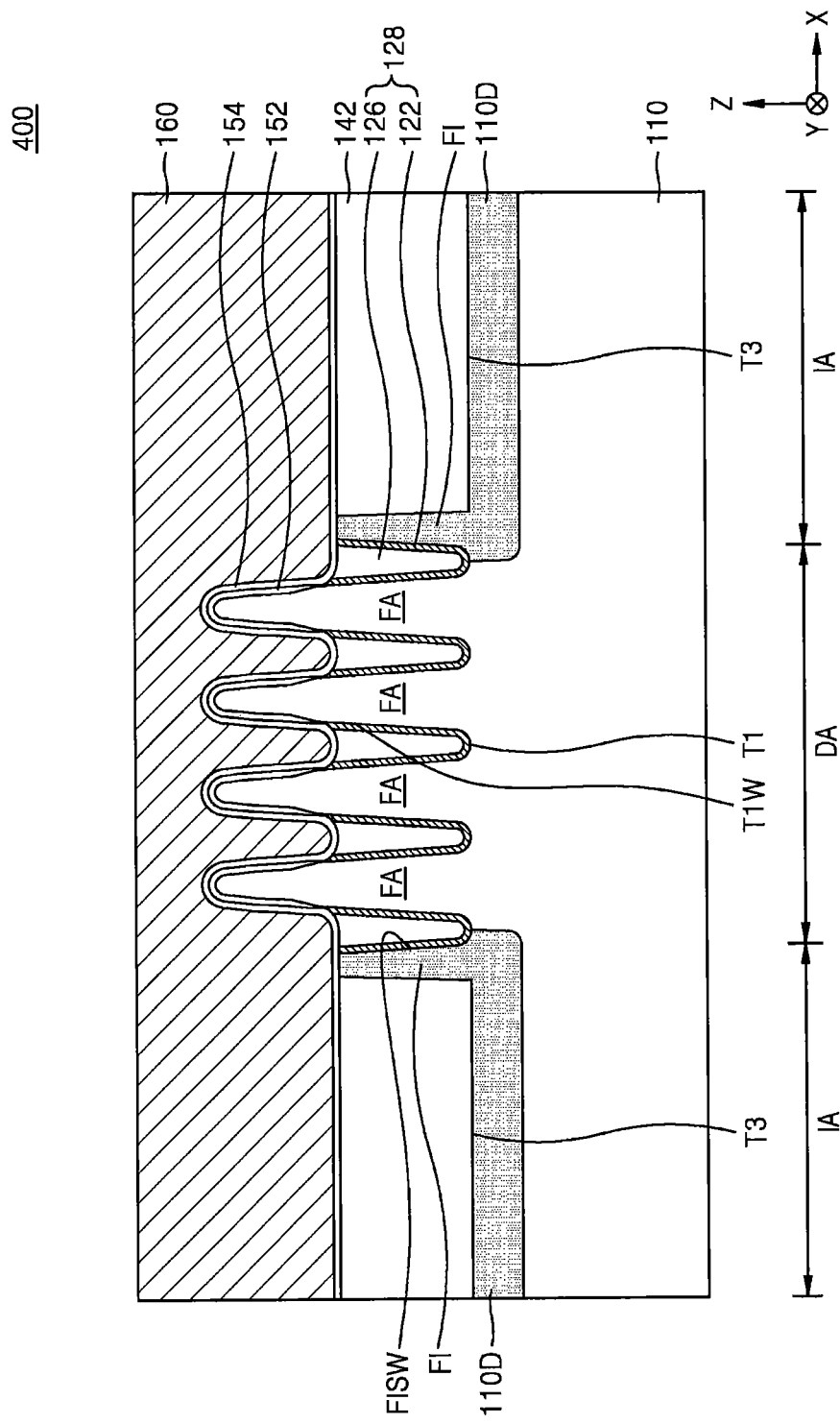

FIGS. 16A to 16C are cross-sectional views illustrating stages of a method of manufacturing an integrated circuit device according to an example embodiment. With reference to FIGS. 16A to 16C, an example method of manufacturing the integrated circuit device 400 illustrated in FIG. 4 is described. In FIGS. 16A to 16C, the same reference numerals denote the same elements as in FIGS. 1A to 15D, and detailed descriptions thereof are omitted here for brevity.

Referring to FIG. 16A, processes as described with reference to FIGS. 13A to 13E may be performed such that a mask pattern 230 defining a device region DA may be formed on a structure in which an inner isolation layer 128 is formed to fill respective spaces between a plurality of preliminary fin-type active regions PA. In this case, as described with reference to FIG. 13E, an actual mask pattern 230A enlarged to have a larger width than the desired mask pattern 230 may be formed.

Next, using the actual mask pattern 230A as an etch mask, a pad oxide pattern 212 and a first mask pattern 214 exposed by the actual mask pattern 230A may be removed by a similar process to that described with reference to FIG. 13F, and then the inner isolation layer 128, the preliminary fin-type active regions PA and a substrate 110 may be etched to form an outer trench T3 exposing the substrate 110 in an inter-device isolation region IA. The outer trench T3 may be formed to have a bottom surface level similar to or the same as a bottom surface level BL1 of a plurality of inner trenches T1 (i.e., a depth of the outer trench T3 may be similar to or the same as a depth of the plurality of inner trenches T1).

Referring to FIG. 16B, by a similar process to or the same process as those described with reference to FIG. 13G, the fin-type sliver FS exposed at an inner sidewall of the outer trench T3 may be converted into a fin-type insulating part FI. While converting the fin-type sliver FS into the fin-type insulating part FI, a portion of the substrate 110 exposed in the outer trench T3 may be converted into a lower insulating part 110D. At opposite sides of the device region DA, the lower insulating part 110D may be integrally connected to the fin-type insulating part FI and may have a shape extending along a surface of the substrate 110.

The process of converting the fin-type sliver FS into the fin-type insulating part FI may be performed using the insulating liner 122 of the inner isolation layer 128 as a converting stop layer. In some embodiments, a thickness of the lower insulating part 110D formed on a bottom surface of the outer trench T3 (e.g., a thickness D41 in a Z direction as shown in FIG. 16B) may be equal to or greater than a maximum width of the fin-type insulating part FI (i.e., a width W41 of a bottom portion of the fin-type insulating part FI in an X direction).

Referring to FIG. 16C, processes similar to or the same as those described with reference to FIGS. 13H to 13J may be performed to form the integrated circuit device 400.

Figure 17:
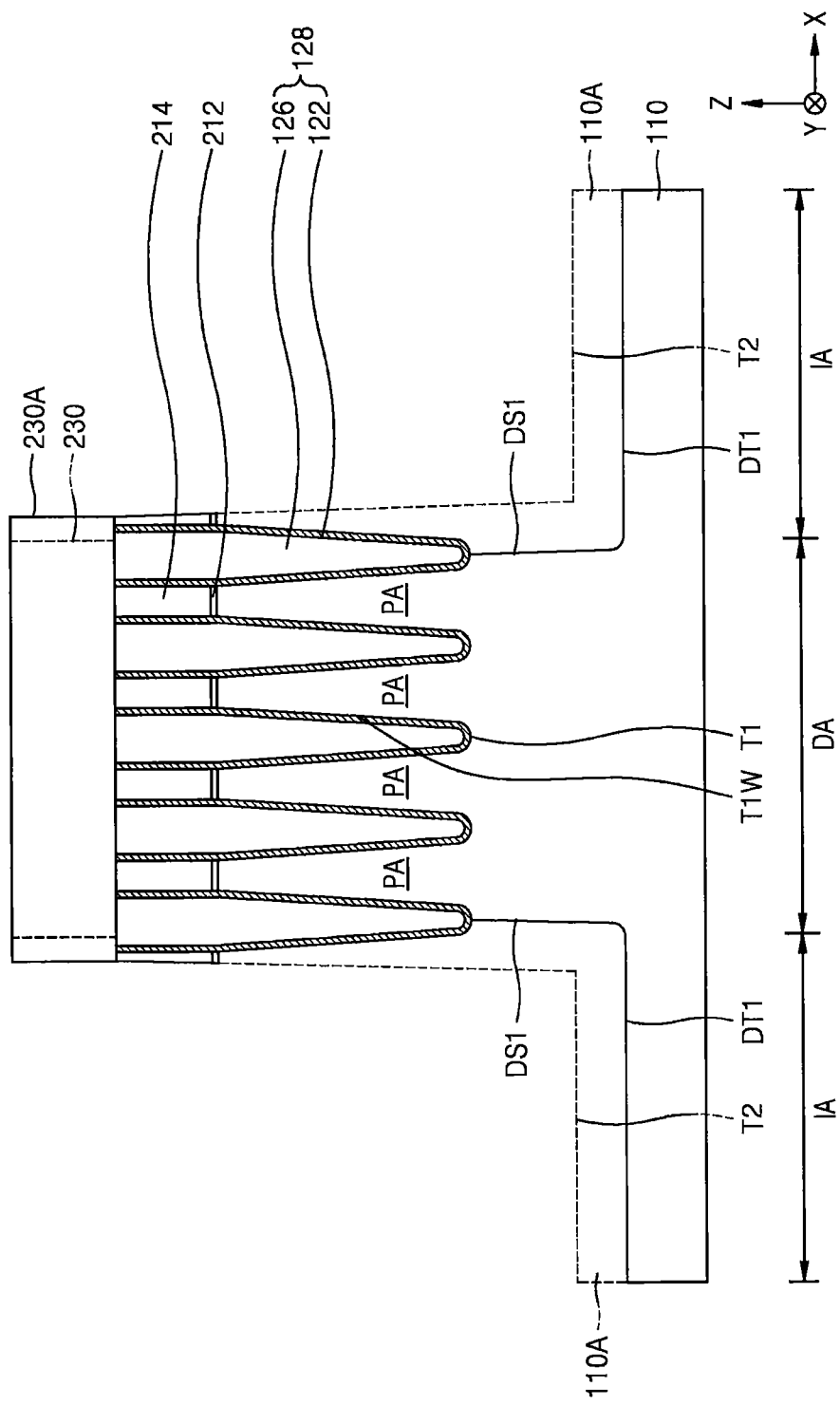
FIG. 17 is a sectional view illustrating a method of manufacturing an integrated circuit device according to an example embodiment.

FIG. 17 is a cross-sectional view illustrating a method of manufacturing an integrated circuit device according to an example embodiment. With reference to FIG. 17, an example method of manufacturing the integrated circuit device 600 illustrated in FIG. 6 is described. In FIG. 17, the same reference numerals denote the same elements as in FIGS. 1A to 13J, and detailed descriptions thereof are omitted here for brevity.

Referring to FIG. 17, processes as described with reference to FIGS. 13A to 13G may be performed such that a fin-type sliver FS (refer to 13F) exposed in an outer trench T2 as shown by a dotted line is converted into a fin-type insulating part FI (refer to FIG. 13G) and a portion of a substrate 110 exposed in the outer trench T2 is converted into a lower insulating part 110A (refer to 13G). After that, the fin-type insulating part FI and the lower insulating part 110A may be selectively removed from a resulting structure.

The fin-type insulating part FI and the lower insulating part 110A may be selectively removed by a wet etch process or a dry etch process.

As shown in FIG. 17, a pad oxide pattern 212 and a first mask pattern 214 which had covered the removed the fin-type insulating part FI may remain intact. However, in the case in which at least a portion of the pad oxide pattern 212 and the first mask pattern 214 is formed of a material similar to or the same as a material contained in the fin-type insulating part FI and the lower insulating part 110A, the at least a portion of the pad oxide pattern 212 and the first mask pattern 214 may be removed together while removing the fin-type insulating part FI and the lower insulating part 110A.

By the removal of the fin-type insulating part FI and the lower insulating part 110A, an outer deep trench DTI that is deeper than the outer trench T2 may be formed. Also, the inner isolation layer located at an edge side of a device region DA may remain in a shape protruding in a direction away from the device region DA at an inner sidewall DS1 of the outer deep trench DT1.

After that, processes similar to or the same as those described with reference to FIGS. 13H to 13J may be performed to form the integrated circuit device 600 as illustrated in FIG. 6.

In some embodiments, the integrated circuit device 500 as illustrated in FIG. 5 may be formed using the method of manufacturing the integrated circuit device as described with reference to FIGS. 13A to 13J. However, in an example process for forming a plurality of inner trenches T1, a pitch of the plurality of pad oxide pattern 212 and the plurality of first mask patterns 214 as described with reference to FIG. 13A may be adjusted such that outermost inner trenches of the plurality of inner trenches T1 are formed to have a greater depth than other inner trenches T1. That is, the plurality of pad oxide patterns 212 and the plurality of first mask patterns 214 may be formed to be arranged in a variable pitch. As a result, when performing the etching process for forming the plurality of preliminary fin-type active regions PA as described with reference to FIG. 13B, the outermost inner trenches may be formed to have a relatively greater depth by a loading effect at a region in which a distance between the plurality of first mask patterns 214 is larger. After that, processes similar to or the same as those described with reference to FIGS. 13C to 13J may be performed to form the integrated circuit device 500.

In some embodiments, to manufacture the integrated circuit devices 700, 800, 900 and 1000, a combined process of the processes described with reference to FIGS. 14A to 16C and the processes described with reference to FIGS. 13A to 13D may be used.

The integrated circuit devices including the FinFETs having three-dimensional channel structure and the methods of manufacturing thereof are described with reference to FIGS. 1A to 17, but the present inventive disclosure is not limited thereto. For example, it will be understood by the ordinary skill in the art that integrated circuit devices including planar MOSFETs having the features of the present disclosure through various changes or modifications within the scope of the present disclosure may be provided.

Figure 18:
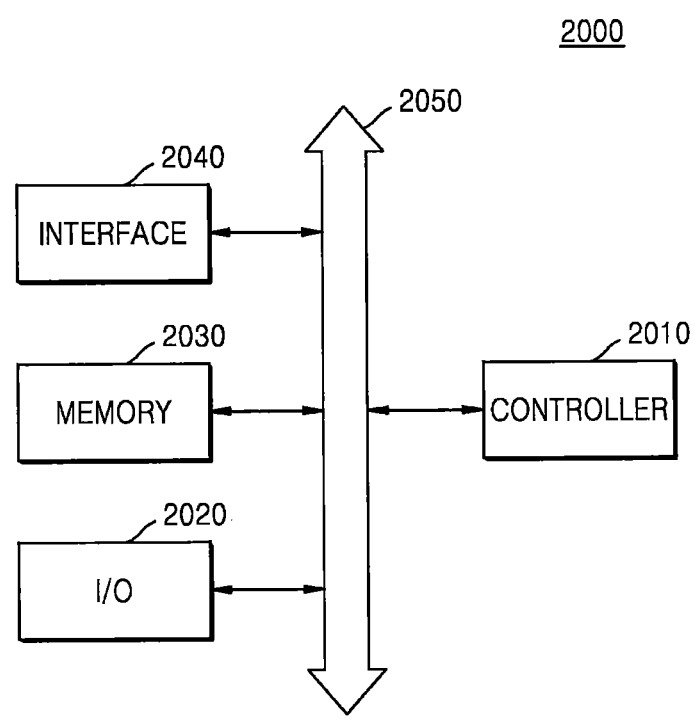
FIG. 18 is a block diagram illustrating an electronic system according to example embodiments.

FIG. 18 is a block diagram of an electronic system 2000 according to an example embodiment.

The electronic system 2000 includes a controller 2010, an input/output (I/O) device 2020, a memory 2030, and an interface 2040, which are connected to one another via a bus 2050.

The controller 2010 may include at least one of a microprocessor, a digital signal processor, and a processing device that is similar thereto. The I/O device 2020 may include at least one of a keypad, a keyboard, and a display. The memory 2030 may be used for storing a command that is executed by the controller 2010. For example, the memory 2030 may be used for storing user data.

The electronic system 2000 may be configured as an apparatus that may transmit and/or receive information under a wireless communication apparatus and/or a wireless environment. In some embodiments of the electronic system 2000, the interface 2040 may be configured as a wireless interface to transmit and/or receive data through a wireless communication network. The interface 2040 may include an antenna and/or a wireless transceiver. In some example embodiments, the electronic system 2000 may be used for a communication interface protocol of a third generation communication system, such as a code division multiple access (CDMA) system, a global system for mobile communications (GSM), a north American digital cellular (NADC) system, an extended-time division multiple access (E-TDMA) system, and/or a wide band code division multiple access (WCDMA) system. The electronic system 2000 includes at least one of the integrated circuit devices 100, 100A, 100B, 200, 300, 400, 500, 600, 700, 800, 900, 1000, and 1100 illustrated in FIGS. 1A through 11, and integrated circuit devices modified and changed therefrom.

While the present disclosure has been particularly shown and described with reference to example embodiments thereof, it will be understood by those of ordinary skill in the art that various changes in form and details may be made therein without departing from the spirit and scope of the present disclosure as defined by the following claims.

What is claimed is:

1. An integrated circuit device comprising:
   at least one fin-type active region in a device region between first and second portions of an inter-device isolation region, the at least one fin-type active region protruding from a substrate in the device region and extending in a first direction;
   a plurality of inner isolation layers in the device region, the plurality of inner isolation layers on sidewalls of the at least one fin-type active region and extending in the first direction; and
   an outer isolation layer in an outer deep trench in the inter-device isolation region, wherein at least one of the plurality of inner isolation layers extends away from the device region and toward the outer deep trench.

2. The integrated circuit device according to claim 1, wherein the outer isolation layer has a sloped sidewall contacting an outermost inner isolation layer of the plurality of inner isolation layers, and
wherein the sloped sidewall is inclined such that a distance between the at least one fin-type active region and the sloped sidewall of the outer isolation layer is shorter as the sloped sidewall approaches the substrate.

3. The integrated circuit device according to claim 1, wherein the outer isolation layer includes:
a fin-type insulating part contacting a sidewall of an outermost inner isolation layer and extending parallel to the at least one fin-type active region;
a lower insulating part extending along a surface of the substrate from the fin-type insulating part; and
an outer gap-fill insulating layer on the fin-type insulating part and on the lower insulating part and in the outer deep trench.

4. The integrated circuit device according to claim 3, wherein the fin-type insulating part has a smaller width than a width of the at least one fin-type active region in a second direction crossing the first direction.

5. The integrated circuit device according to claim 3, wherein each of the plurality of inner isolation layers includes an insulating liner on at least one of the sidewalls of the at least one fin-type active region, and
wherein the fin-type insulating part is in direct contact with the insulating liner of the outermost inner isolation layer.

6. The integrated circuit device according to claim 3, wherein the fin-type insulating part has a sloped sidewall contacting the sidewall of the outermost inner isolation layer, and
wherein the sloped sidewall is inclined such that a spaced distance from the at least one fin-type active region is shorter as the fin-type insulating part is closer to the substrate.

7. The integrated circuit device according to claim 3, wherein the fin-type insulating part has a larger width closer to the substrate in a second direction orthogonal to the first direction.

8. The integrated circuit device according to claim 1, wherein the outer isolation layer includes two fin-type insulating parts spaced apart from each other with the device region therebetween, and
wherein the two fin-type insulating parts contact respective sidewalls of the inner isolation layers located at opposite outermost sides of the device region among the plurality of inner isolation layers and extend parallel to the at least one fin-type active region.

9. The integrated circuit device according to claim 1, wherein the outer isolation layer includes a fin-type insulating part located at only a side of the device region, and
wherein the fin-type insulating part contacts a sidewall of an outermost inner isolation layer and extends parallel to the at least one fin-type active region.

10. An integrated circuit device comprising:
a fin-type active region in a device region of a substrate and extending in a first direction;
an inner isolation layer in a trench having a first depth, in the device region, the inner isolation layer on a sidewall of the fin-type active region; and
an outer isolation layer in an outer deep trench having a second depth deeper than the first depth, around the device region, the outer isolation layer contacting the inner isolation layer,
wherein the inner isolation layer extends away from the device region and toward the outer isolation layer,
wherein the outer isolation layer has a sloped sidewall contacting the inner isolation layer, and
wherein the sloped sidewall is inclined such that a distance between the fin-type active region and the sloped sidewall of the outer isolation layer is shorter as the sloped sidewall is closer to the substrate.

11. The integrated circuit device according to claim 10, wherein the outer isolation layer includes a fin-type insulating part that contacts the inner isolation layer and extends along the first direction parallel to the fin-type active region.

12. The integrated circuit device according to claim 10, wherein the outer isolation layer includes:
a fin-type insulating part having a sloped sidewall; and
a lower insulating part integrally connected to the fin-type insulating part, the lower insulating part extending along a surface of the substrate in the outer deep trench and having a thickness equal to or larger than a width of the fin-type insulating part.

13. The integrated circuit device according to claim 10, wherein the outer isolation layer includes an outer gap-fill insulating layer in the outer deep trench,
the outer gap-fill insulating layer has a surface contacting the substrate and a sloped sidewall contacting the inner isolation layer, and
the sloped sidewall is at a higher level than the surface contacting the substrate.

14. An integrated circuit device comprising:
a device region on a substrate, wherein the device region is between a first portion and a second portion of an isolation region;
a plurality of fin-type active regions in the device region, each fin-type active region comprising sidewalls, each sidewall comprising thereon a respective inner isolation layer from a plurality of inner isolation layers; and
an outer isolation layer in an outer trench in the isolation region; wherein the plurality of fin-type active regions comprises an outermost fin-type active region, wherein the outermost fin-type active region corresponds with an outermost one of the inner isolation layers, and wherein the outermost one of the inner isolation layers extends away from the device region and into the isolation region.

15. The integrated circuit device according to claim 14, wherein an inner sidewall is sloped such that a distance between the outer isolation layer and the outermost fin-type active region decreases as the inner sidewall approaches the substrate.

16. The integrated circuit device according to claim 14, wherein each of the plurality of fin-type active regions extends above an upper surface of the outer isolation layer.

17. The integrated circuit device according to claim 14, wherein the inner isolation layers are in a plurality of trenches, and wherein a first trench of the plurality of trenches is between a pair of the fin-type active regions.

18. The integrated circuit device according to claim 17, wherein an outermost trench is between the outermost fin-type active region and the isolation region and is deeper than the first trench.

19. The integrated circuit device according to claim 14, wherein the outer isolation layer comprises a fin-type insulating part, a lower insulating part integrally connected to the fin-type insulating part, and an outer gap-fill insulating layer on the lower insulating part.

20. The integrated circuit device according to claim 19, wherein one of the plurality of inner isolation layers comprises an insulating liner on a sidewall of a corresponding one of the fin-type active regions, and wherein the fin-type insulating part directly contacts the insulating liner.

\* \* \* \* \*